US010274522B2

(12) United States Patent
Cook

(10) Patent No.: US 10,274,522 B2
(45) Date of Patent: Apr. 30, 2019

(54) MOBILE DEVICE COUPLED ROGOWSKI COIL

(71) Applicant: Veris Industries, LLC, Tualatin, OR (US)

(72) Inventor: Martin Cook, Tigard, OR (US)

(73) Assignee: Veris Industries, LLC, Tualatin, OR (US)

(*) Notice: Subject to any disclaimer, the term of this patent is extended or adjusted under 35 U.S.C. 154(b) by 36 days.

(21) Appl. No.: 15/179,025

(22) Filed: Jun. 10, 2016

(65) Prior Publication Data

US 2017/0059625 A1 Mar. 2, 2017

Related U.S. Application Data

(60) Provisional application No. 62/213,478, filed on Sep. 2, 2015.

(51) Int. Cl.
G01R 15/18 (2006.01)
G06F 1/16 (2006.01)
G06F 1/26 (2006.01)
G06F 1/3203 (2019.01)

(52) U.S. Cl.
CPC ......... G01R 15/181 (2013.01); G06F 1/1684 (2013.01); G06F 1/26 (2013.01); G06F 1/3203 (2013.01)

(58) Field of Classification Search
None
See application file for complete search history.

(56) References Cited

U.S. PATENT DOCUMENTS

| 4,709,339 | A | 11/1987 | Fernandes |
| 5,414,400 | A | 5/1995 | Gris et al. |
| 5,582,395 | A | 12/1996 | Cheng |
| 6,313,623 | B1 | 11/2001 | Kojovic et al. |
| 7,227,441 | B2 | 6/2007 | Skendzic et al. |
| 7,227,442 | B2 | 6/2007 | Skendzic |
| 7,538,541 | B2 | 5/2009 | Kojovic |
| 7,564,233 | B2 | 7/2009 | Kojovic |
| 7,902,812 | B2 | 3/2011 | Kojovic |
| 7,986,968 | B2 | 7/2011 | Dobrowski et al. |
| 8,330,449 | B2 | 12/2012 | Greenberg |
| 8,872,611 | B2 | 10/2014 | Rouaud et al. |
| 9,329,659 | B2* | 5/2016 | Cook ............... G06F 1/3206 |
| 9,442,139 | B2 | 9/2016 | Hobelsberger et al. |
| 9,448,258 | B2 | 9/2016 | Garabieta et al. |
| 2004/0183522 | A1* | 9/2004 | Gunn ............... G01R 15/185 324/126 |
| 2007/0069715 | A1* | 3/2007 | Bruno ............... G01R 21/133 324/76.11 |
| 2007/0236208 | A1* | 10/2007 | Kojovic ............... H02H 1/0007 324/127 |
| 2008/0084389 | A1* | 4/2008 | Mac ............... H04N 5/4403 345/158 |
| 2008/0191704 | A1 | 8/2008 | Gholami et al. |
| 2011/0012587 | A1 | 1/2011 | Greenberg |

(Continued)

FOREIGN PATENT DOCUMENTS

WO 2006108021 A2 10/2006
WO 2012022779 A1 2/2012

Primary Examiner — Paresh H Patel
(74) Attorney, Agent, or Firm — Chernoff, Vilhauer, McClung & Stenzel, LLP

(57) ABSTRACT

A coil that includes a coupled mobile device.

10 Claims, 28 Drawing Sheets

(56) References Cited

U.S. PATENT DOCUMENTS

| | | |
|---|---|---|
| 2011/0043190 A1 | 2/2011 | Farr |
| 2014/0189551 A1* | 7/2014 | Kim .................... G06F 3/04817 |
| | | 715/765 |
| 2016/0055963 A1 | 2/2016 | Lockstedt et al. |
| 2016/0091535 A1 | 3/2016 | Bannister et al. |
| 2017/0059620 A1* | 3/2017 | Cook .................... G01R 15/181 |
| 2017/0059621 A1* | 3/2017 | Cook .................... G01R 15/181 |
| 2017/0059622 A1* | 3/2017 | Cook .................... G01R 15/181 |
| 2017/0059623 A1* | 3/2017 | Cook .................... G01R 15/181 |
| 2017/0059624 A1* | 3/2017 | Cook .................... G01R 15/181 |

* cited by examiner

FIG. 26

MOBILE DEVICE COUPLED ROGOWSKI COIL

CROSS-REFERENCE TO RELATED APPLICATIONS

This application claims the benefit of U.S. Provisional App. No. 62/213,478, filed Sep. 2, 2015.

TECHNICAL FIELD

The present disclosure relates generally to a Rogowski coil.

BACKGROUND OF THE INVENTION

A number of different types of measurement devices may be utilized to detect or monitor current signals. For example, measurement devices are typically integrated into utility meters in order to monitor the current on one or more phases of an electrical power signal. In conventional devices, current transformers, shunts, and Hall Effect transducers are traditionally used to monitor current signals. More recently, Rogowski coils have been utilized to monitor current signals. With a Rogowski coil, current flowing through a conductor generates a magnetic field that induces a voltage in the coil. Using the voltage output signal of the coil, current conditions within the conductor can be calculated.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 26 illustrates a set of coils and modules for multiple sets.

DETAILED DESCRIPTION OF PREFERRED EMBODIMENT

Figure 1:
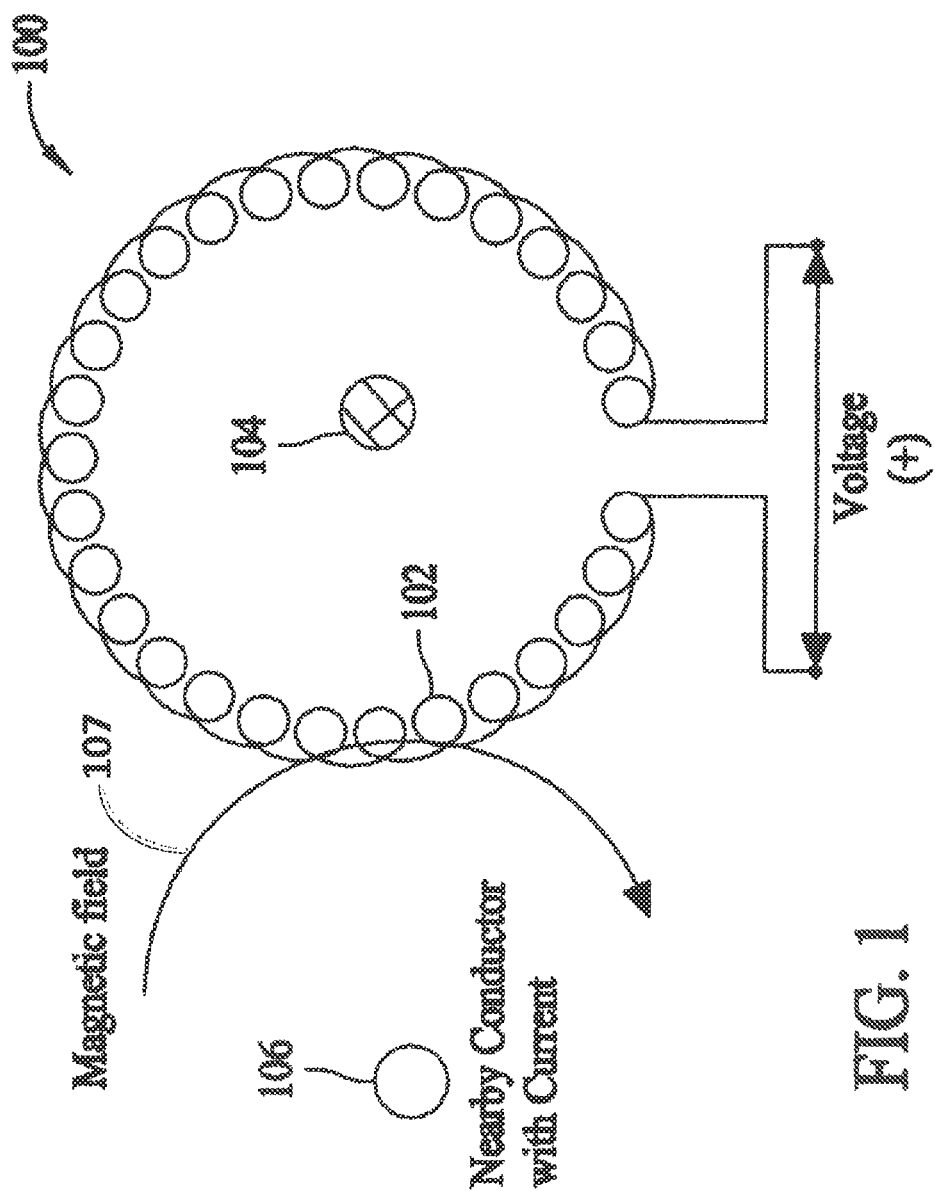
FIG. 1 illustrates a Rogowski coil, an internal conductor, and an external conductor.

Referring to FIG. 1, a Rogowski coil 100 is generally fabricated from a conductor 102, that may include a wire, that is coiled or wound on a substantially non-magnetic core, which may be, for example, air or a substantially non-magnetic material. The 102 coil may be placed around a conductor or conductors 104 whose current(s) is to be measured with the coil 102. A primary current flowing through the conductor 104 generates a magnetic field that, in turn, induces a voltage in the coil 102. A voltage output v(t) of the coil 102 is generally governed by the following Equation:

$$v(t) = -\mu_o \mu_r n S [di(t)/dt] = -M[di(t)/dt].$$

where $\mu_o$, is the magnetic permeability of free space, $\mu_r$ is the relative permeability (the ratio of the permeability of the coil 102 to the permeability of free space $\mu_o$), n is the winding density (turns per unit length), S is the cross sectional area of the core in the Rogowski coil, and M represents the mutual reactance or mutual coupling between the coil 102 and the conductor 104. In a similar manner, the output of the coil may be a current signal i(t).

For an ideal Rogowski coil 102, M is independent of the location of the conductor 104 within the coil 102. The Rogowski coil output voltage v(t) is proportional to the rate of change of the measured current i(t) flowing in the conductor 104. The coil output voltage v(t) may be integrated to determine the current i(t) in the conductor 104.

Figure 2B:
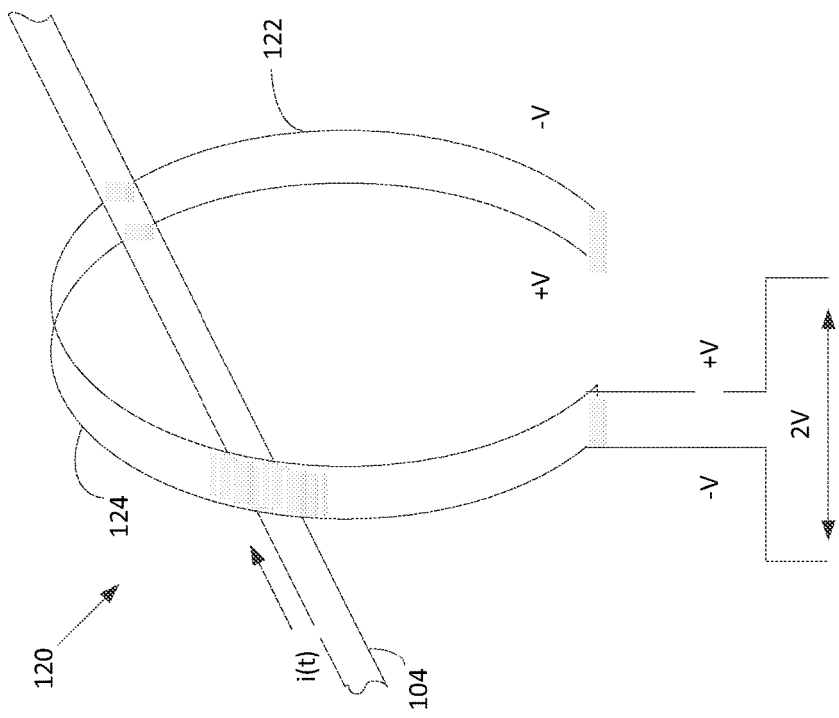
FIG. 2B illustrates a further modified Rogowski coil.
Figure 2A:
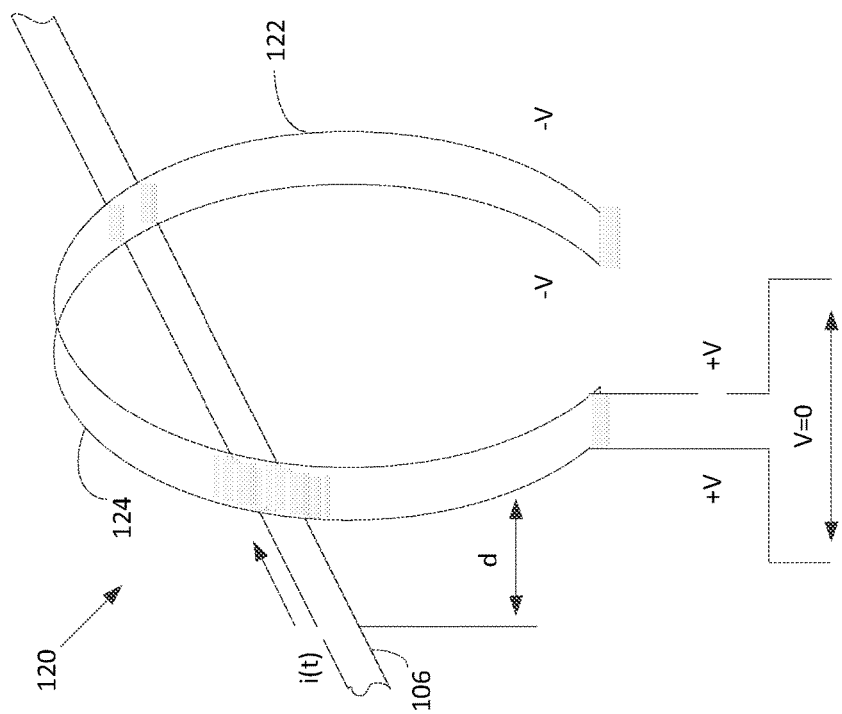
FIG. 2A illustrates a modified Rogowski coil.

Referring also to FIG. 2A, to reduce undesirable influence of a nearby conductor 106, which generates an electromagnetic field 107, a coil 120 may include first and second wire coils or loops 122, 124 wound in electrically opposite directions. The two coils 122, 124 effectively cancel substantially all electromagnetic fields coming from outside the coil 120. One or both loops 122, 124 may be configured from a wound wire on the core. If only one loop wire wound on a non-magnetic core is utilized, then the other loop may be returned through the center of the coil 120 to cancel undesirable effects of external magnetic fields.

Referring also to FIG. 2B, both loops 122 and 124 may include wound wires, with the second winding 124 being wound in the opposite direction. In this configuration, the voltage induced in the coil 120 from the conductor passing through the coil will be doubled.

Figure 3:
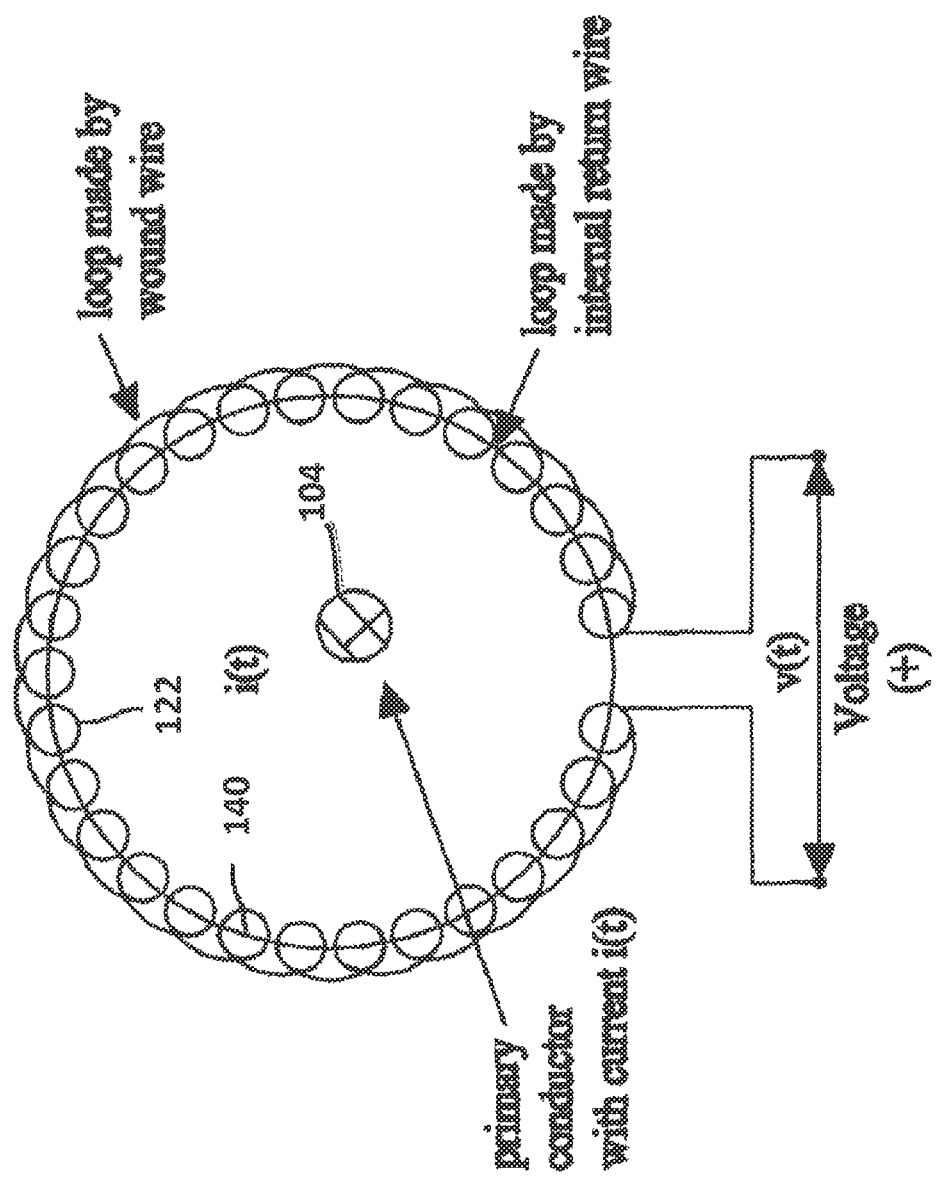
FIG. 3 illustrates a further modified Rogowski coil.

Referring to FIG. 3, a Rogowski coil may include a substantially flexible, nonmagnetic core 140 such as cores commonly used in known coaxial cables. Insulating jackets and shielding from such cables, may be stripped to obtain the cores, and after cutting the cable core to size, the coil 122 (and 124) may be wound over the core 140. Existing conductors extending through the center of the core 140 may serve as the return loop for reduction of external magnetic fields, as described above. In lieu of such flexible cores 140, coils may be fabricated from relatively rigid and straight rods that may be manufactured with a more uniform cross sectional area than the flexible cores. In lieu of such flexible cores 140, coils may be fabricated on dielectric material, such as a patterned circuit board.

The output of the coils tend to be susceptible to noise, signal distortion, and undesirable influences by surrounding conductors and equipment in the vicinity of the coils. To reduce such influences shielding may be included.

Figure 4:
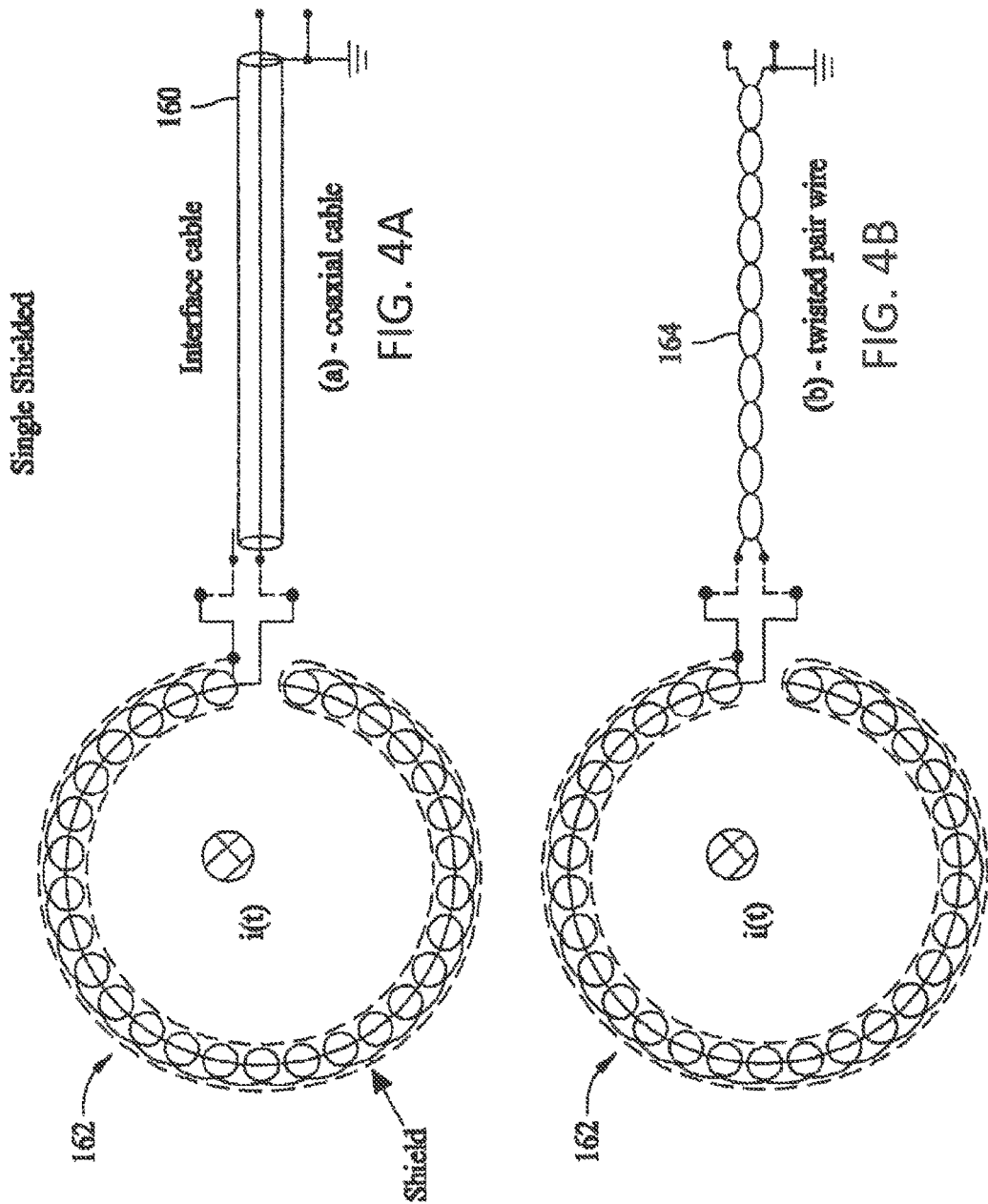
FIG. 4A illustrates a further modified Rogowski coil and connection.
FIG. 4B illustrates a further modified Rogowski coil and connection.

Referring to FIG. 4A, the Rogowski coil and its secondary leads may include a shielded coaxial cable 160 that is connected to a coil 162. Referring to FIG. 4B, a twisted pair wire 164 is connected to the coil 162. The twisted wires carry equal but opposite signals and are less susceptible to noise issues and cross talk issues from adjacent signal conductors. The shielded cable 160 and the twisted pair wire 164 provide protection against noise and electromagnetic influences in the environment of the coils 162.

Figure 5:
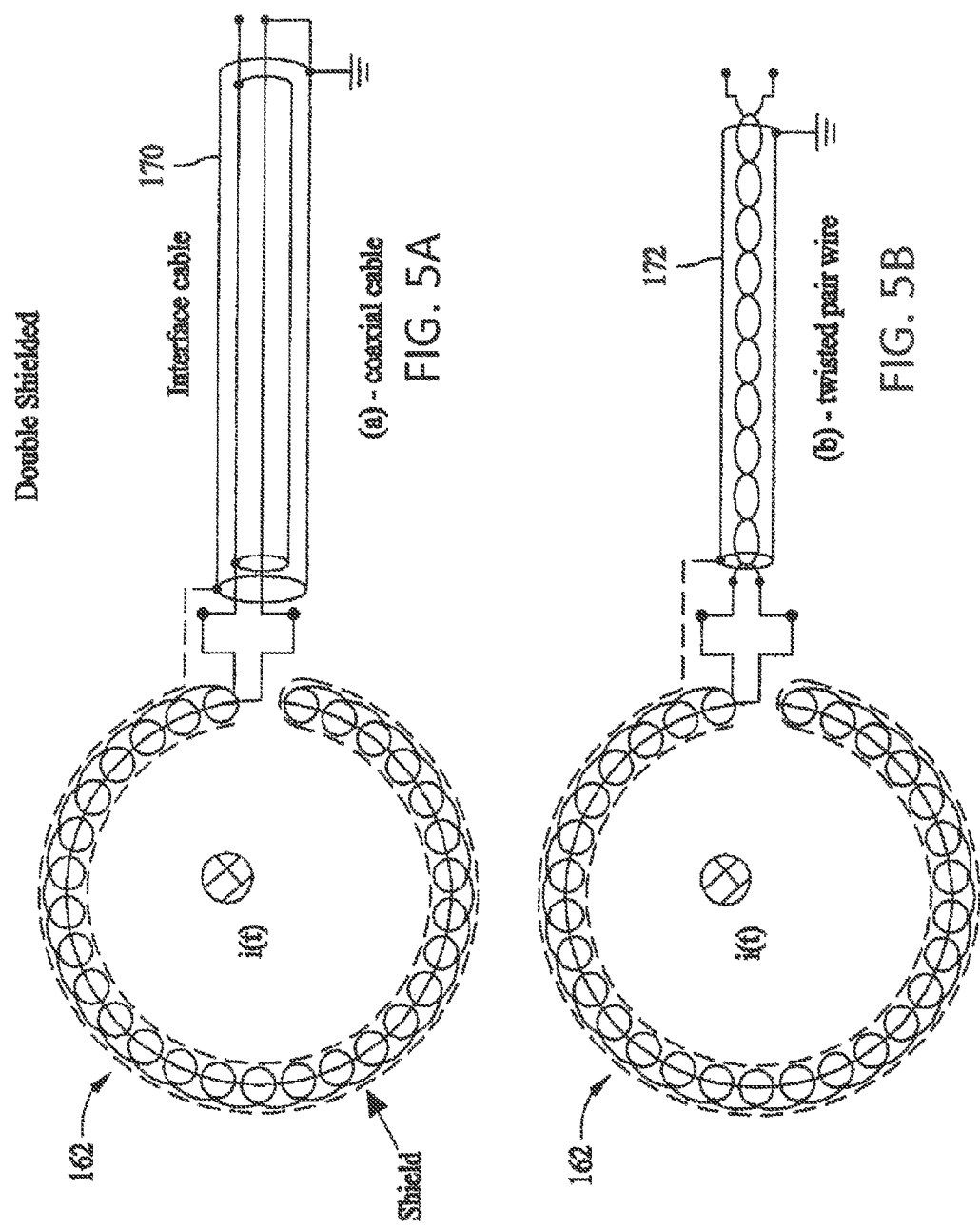
FIG. 5A illustrates a further modified Rogowski coil and connection.
FIG. 5B illustrates a further modified Rogowski coil and connection.

FIGS. 5A and 5B illustrate another approach for improving the integrity of the coil output signals. FIG. 5A illustrates a double shielded cable 170 having concentric layers of insulation around the signal conductors in the cable. FIG. 5B illustrates a shielded twisted pair wire 172. The double shielding shown in FIGS. 5A and 5B are more effective than the single shielding features shown in FIGS. 4A and 4B.

Figure 6:
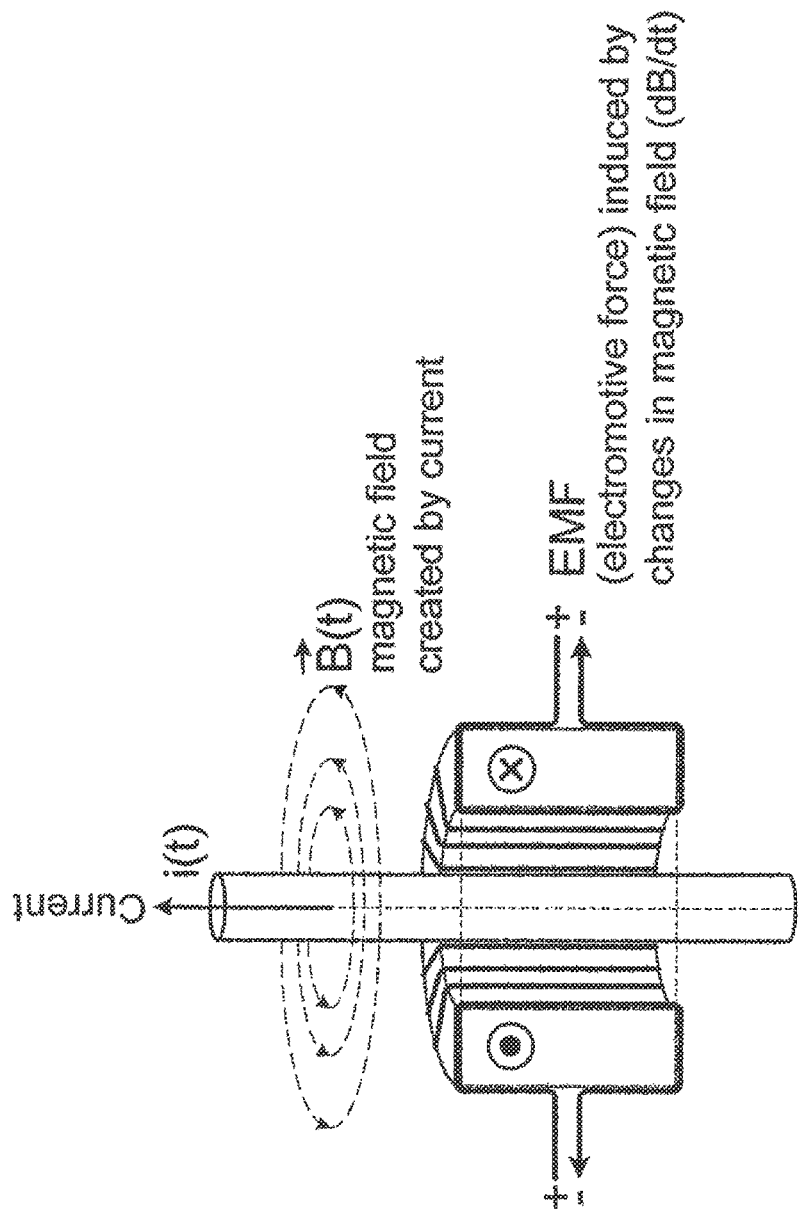
FIG. 6 illustrates a Rogowski coil and its electromotive force.

Referring to FIG. 6, an exemplary diagram of a Rogowski coil arranged around a long straight wire perpendicular to the magnetic field is shown, illustrating the magnetic field (B field) generated by the current i(t). Moreover, as previously described, the EMF may be generally determined by $EMF=-Md(i)/dt$.

Figure 7:
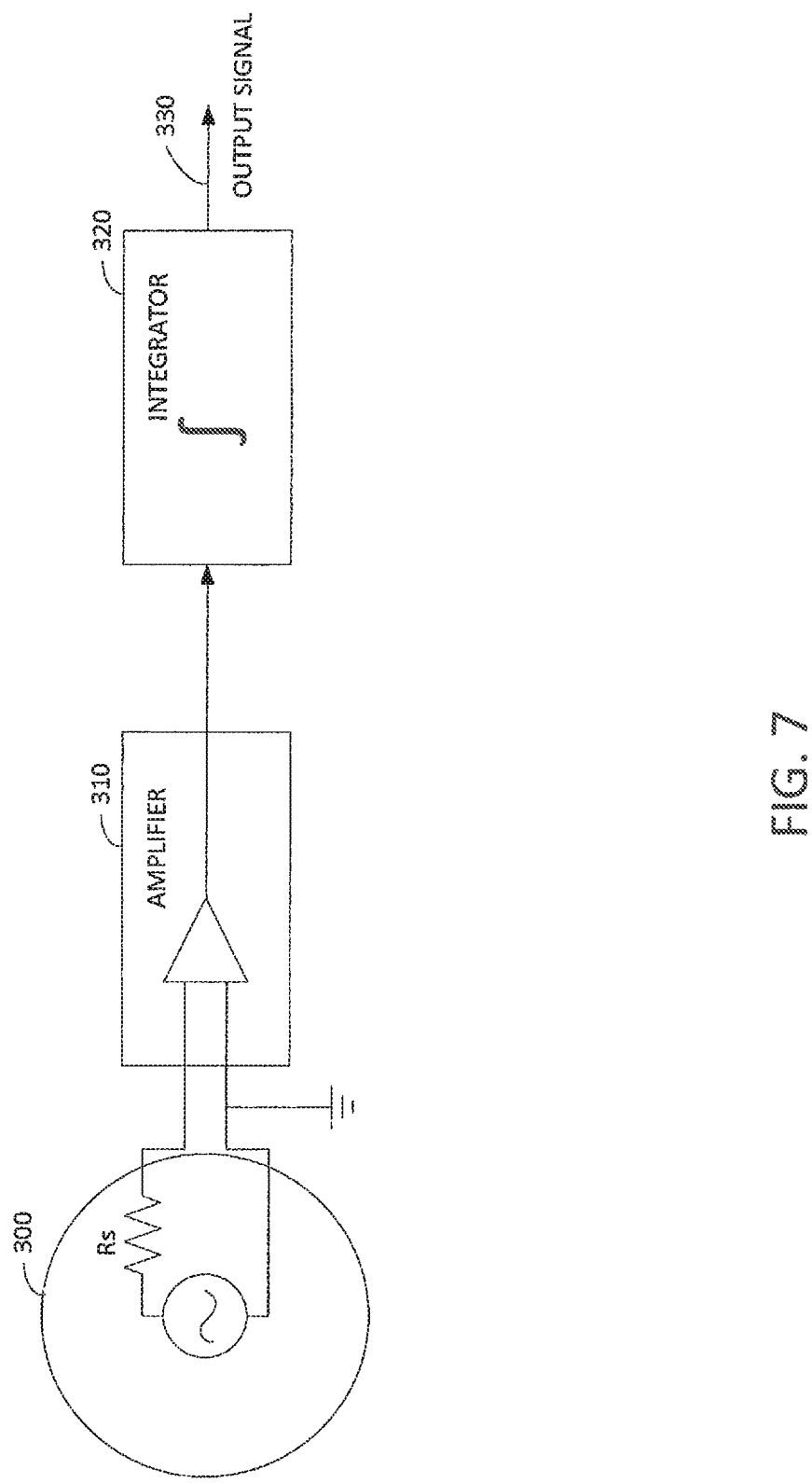
FIG. 7 illustrates a Rogowski coil, together with an amplifier and an integrator.

Referring to FIG. 7, since the output signal from the Rogowski coil 300, which includes a resistance Rs, tends to be relatively small the signal is preferably amplified using a suitable amplification circuit 310. The output of the Rogowski coil 300 is received by the amplification circuit 310. The output of the amplification circuit 310 is then preferably integrated using an integrator 320 to provide an output signal 330 indicative of the current. The integrator 320 preferably includes compensation for a 90 degree phase shaft and a 20 dB/decade gain generated by the Rogowski coil.

Figure 8:
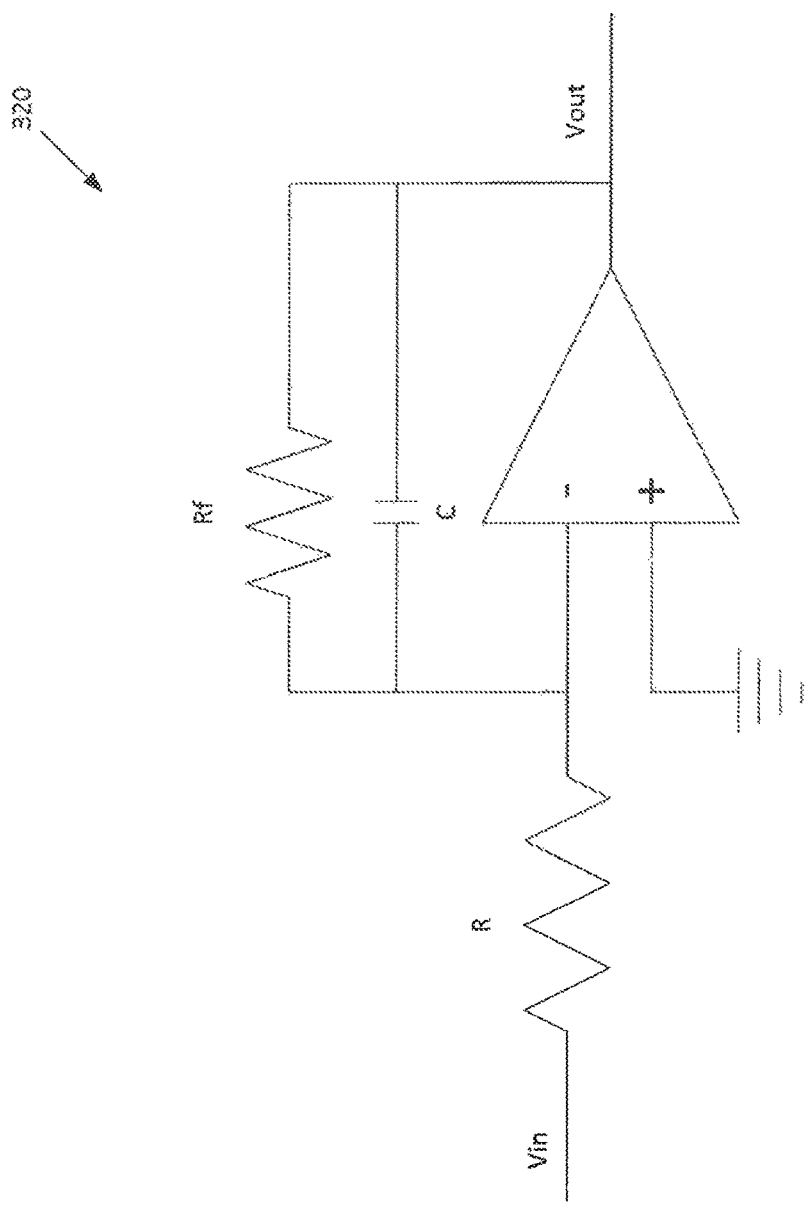
FIG. 8 illustrates an integrator.

Referring to FIG. 8, an exemplary integrator 320 may include an inverting operational amplifier and a resistor-capacitor circuit.

Figure 9:
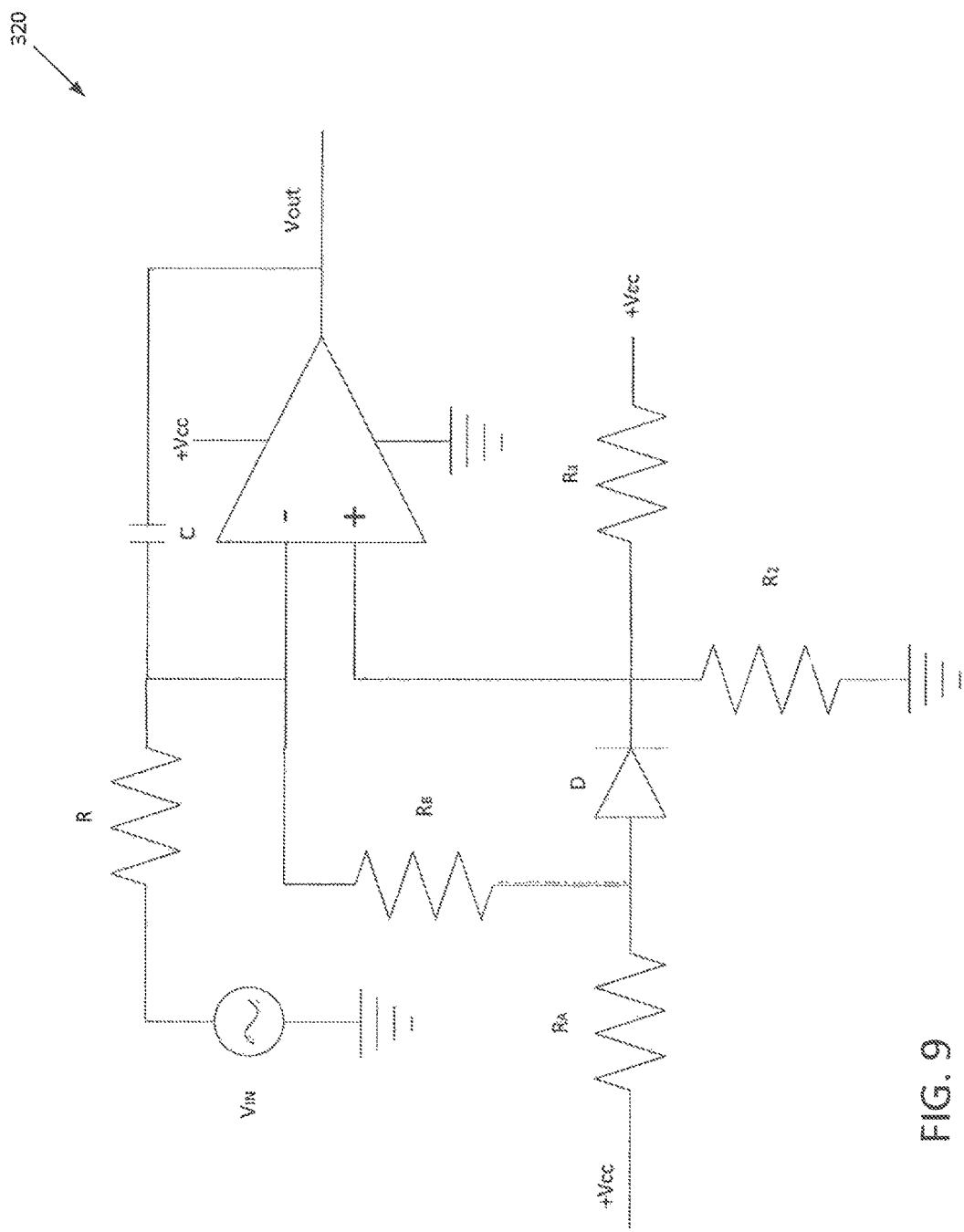
FIG. 9 illustrates another integrator.

Referring to FIG. 9, an exemplary integrator 320 may include an operational amplifier with input current compensation. The resistors R1 and R2 are relatively small, and the resistor $R_B$ is relatively large. It is to be understood that the amplification and/or integration may be performed using firmware using any computing process.

Figure 10:
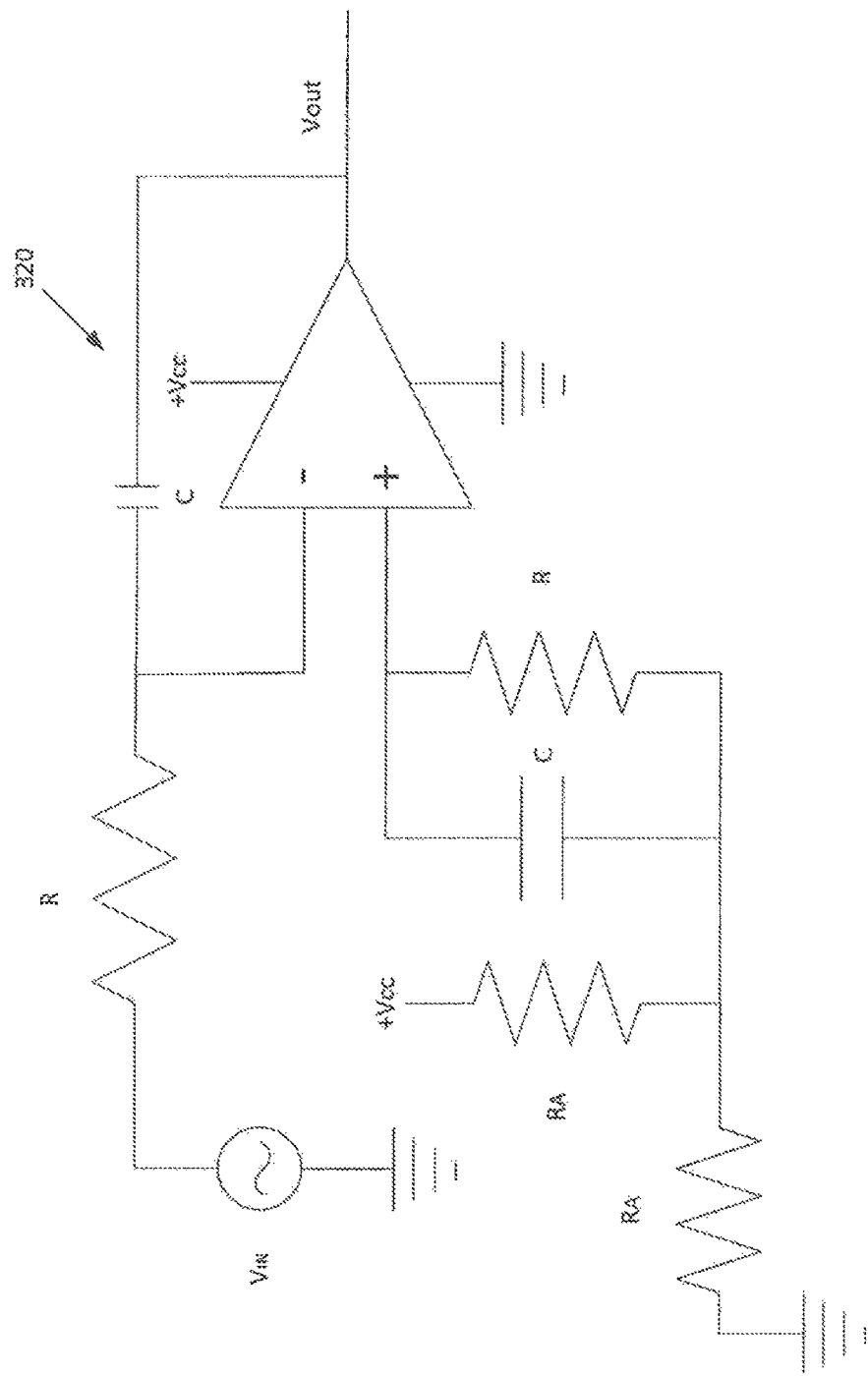
FIG. 10 illustrates another integrator.

Referring to FIG. 10, an exemplary integrator 320 may include an operational amplifier with drift compensation. The positive input current drops the same voltage across the parallel RC combination as the negative input current drops across its series RC combination.

Figure 11A:
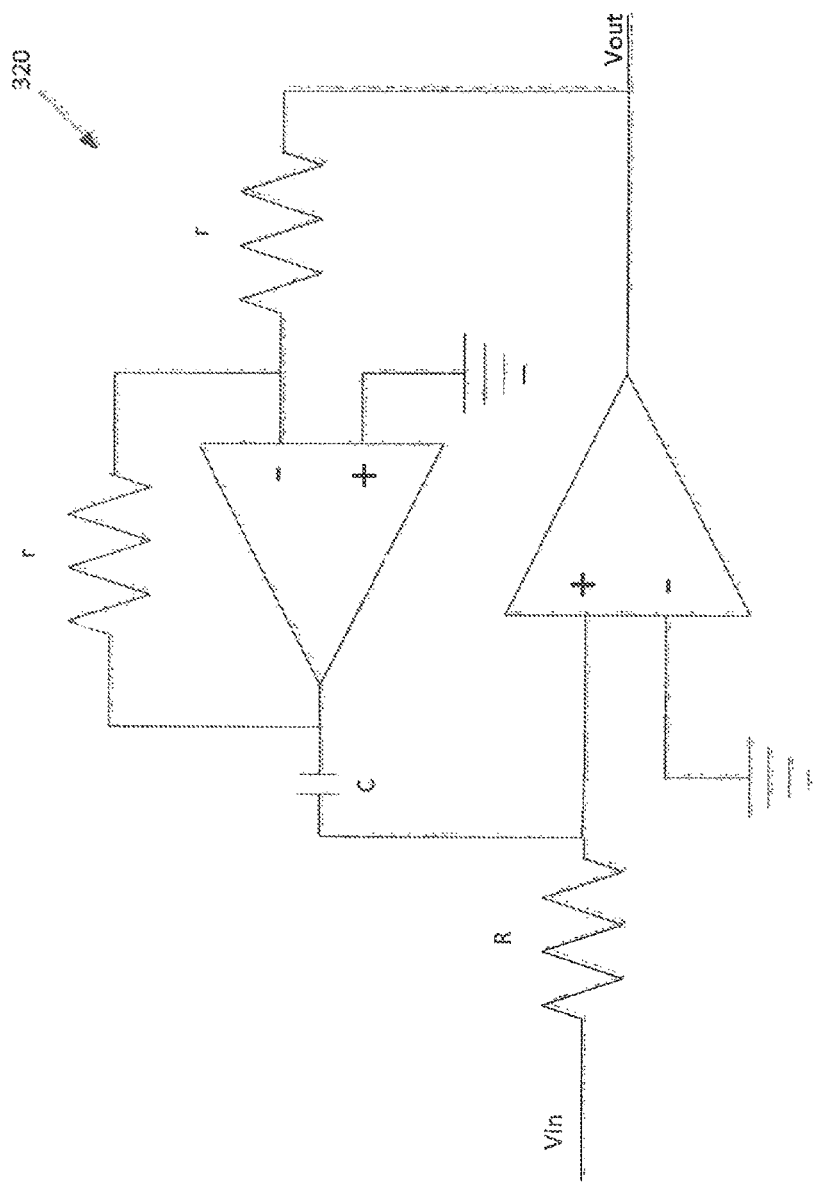
FIGS. 11A-B illustrate other integrators.
Figure 11B:
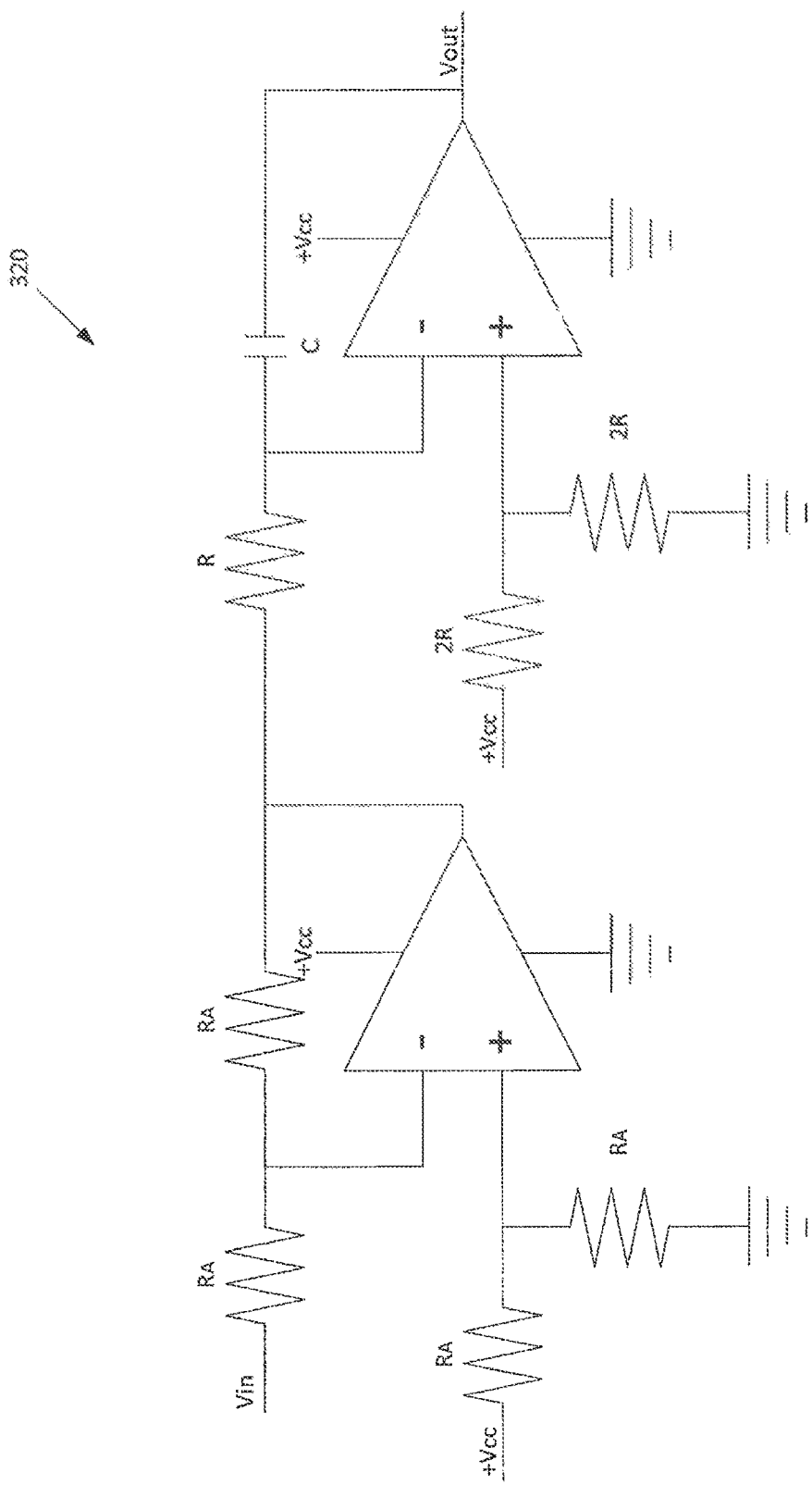

Referring to FIGS. 11A-B, an exemplary integrator 320 may include two operational amplifiers with a non-inverting integrator and an inverting buffer.

Figure 12:
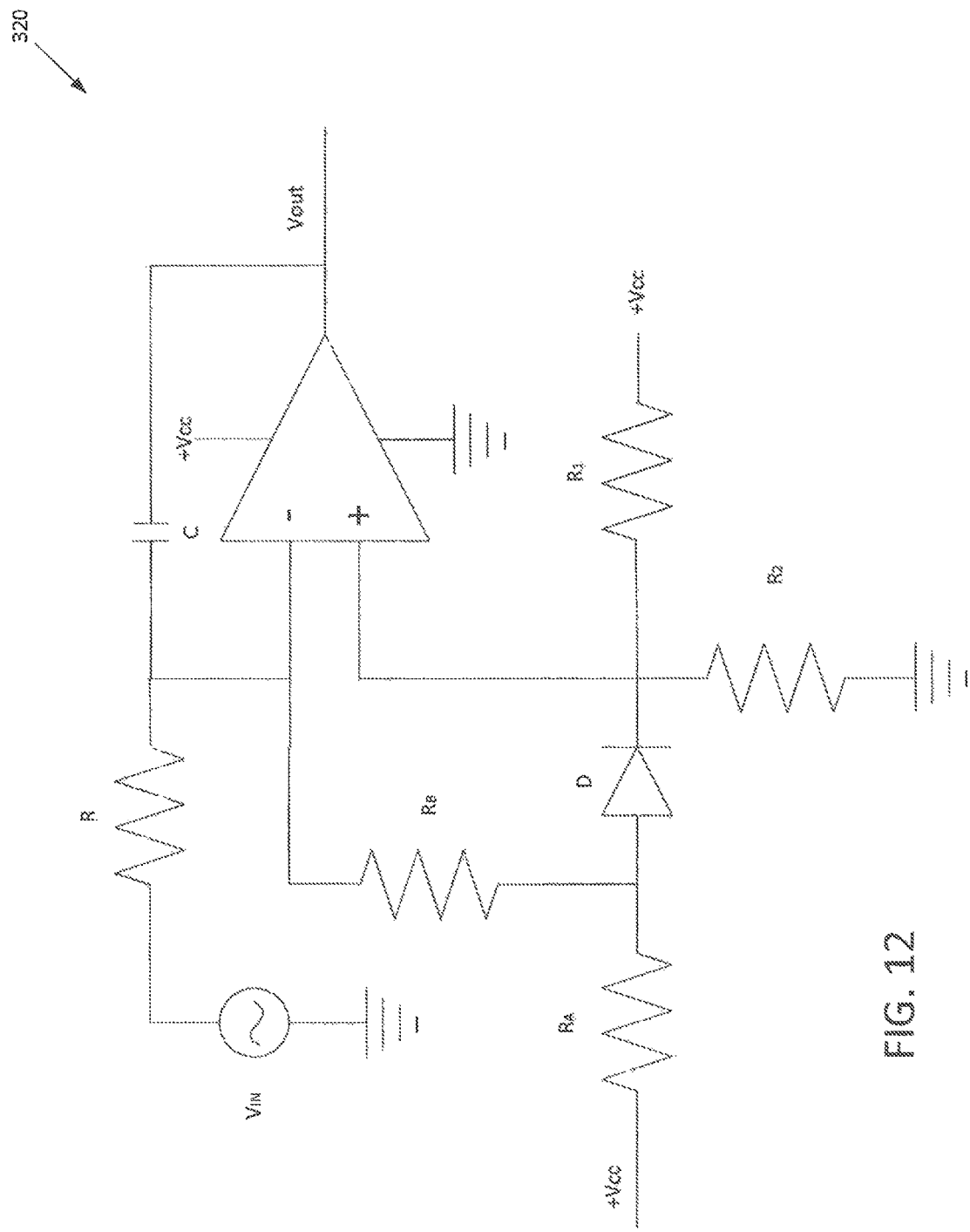
FIG. 12 illustrates another integrator.

Referring to FIG. 12, an exemplary integrator 320 may include an operational amplifier with an inverting integrator with a resistive reset.

Figure 13:
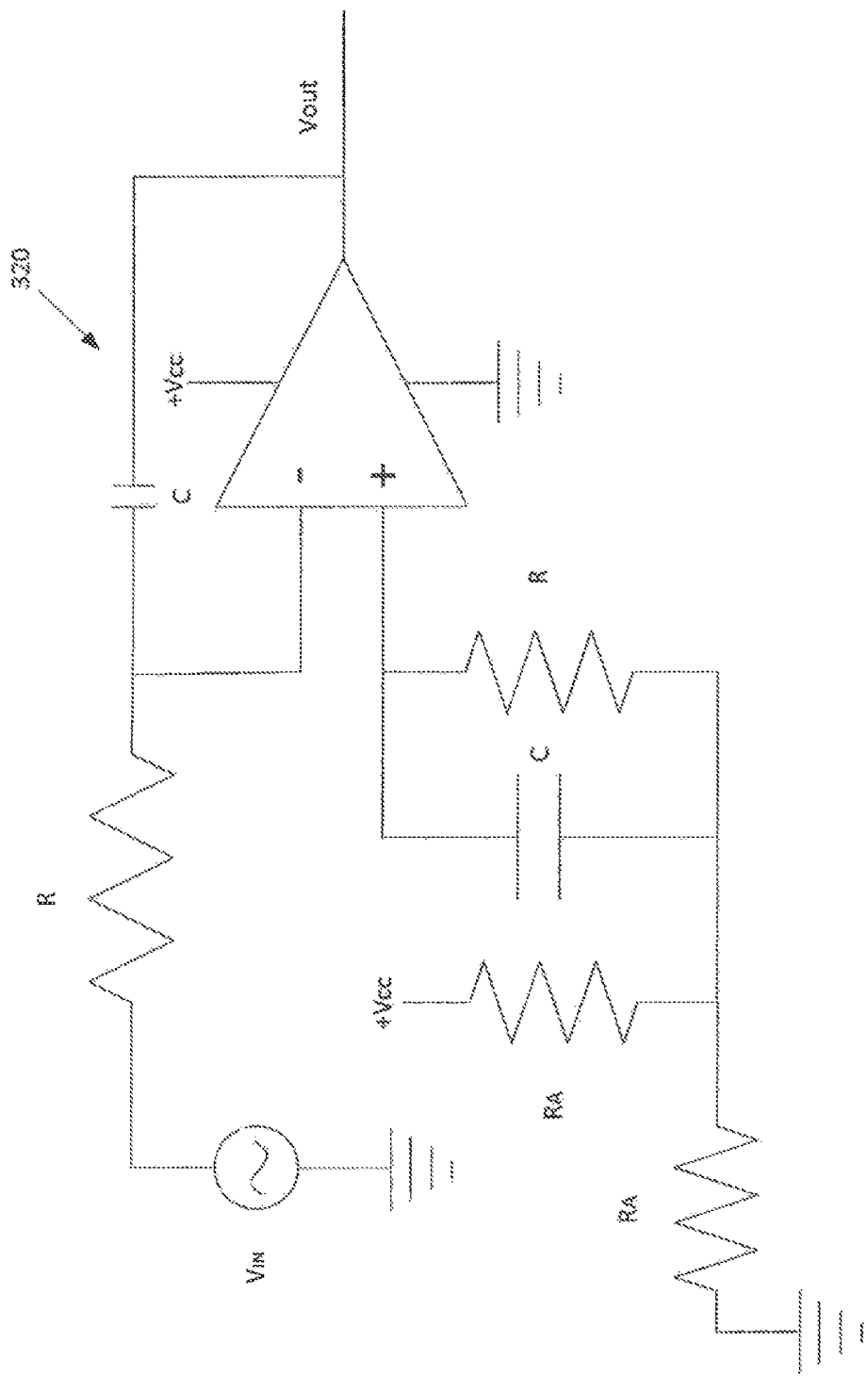
FIG. 13 illustrates another integrator.

Referring to FIG. 13, an exemplary integrator 320 may include an operational amplifier with an inverting integrator with an electronic reset.

It is to be understood that other active circuits may likewise be used, as desired. It is to be understood that a digital integrator may be used, if desired. It is to be understood that passive circuits may likewise be used, as desired.

Figure 14:
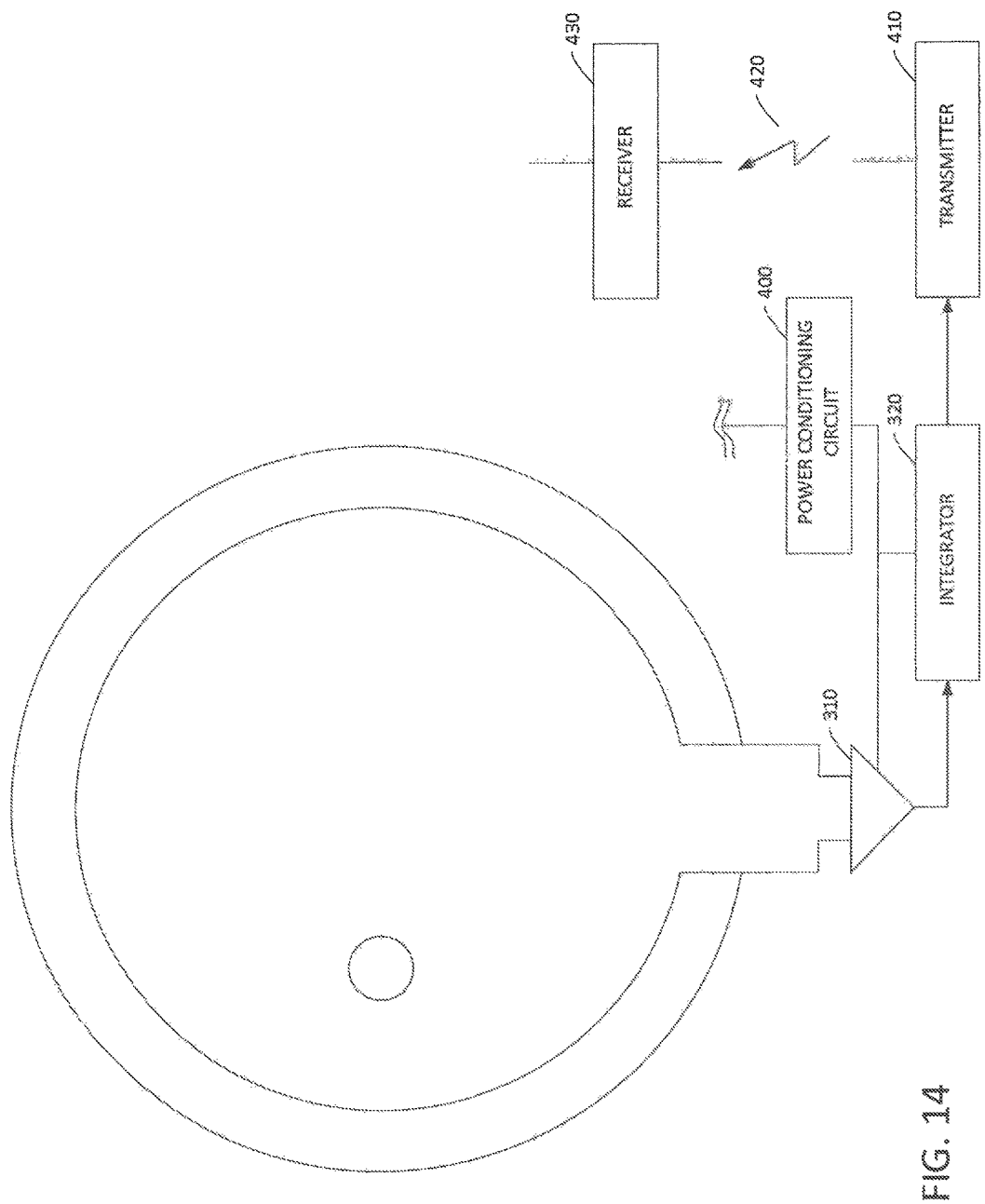
FIG. 14 illustrates a Rogowski coil with a transmitter and a receiver.

Referring to FIG. 14, a Rogowski coil may include a transmitter 410 that receives the output from the amplifier 310 and/or integrator 320. The output from the amplifier 310 and/or integrator 320 may be provided to a transmitter 410 which transmits a wireless signal 420. The power for the transmitter 410 may be provided from the Rogowski coil and/or a separate coil and/or another power source. A power conditioning circuit 400 may be included, if desired. In this manner, the amplifier 310 and/or integrator 320 together with the transmitter 410 may be provided from power available locally without the need for an external power source. A wireless receiver 430 may be remotely located from the transmitter 410 that receives the transmitted signals 420. The received wireless signals may be provided to a power meter or other electrical monitoring device or a mobile device, such as a cellular phone.

Figure 15:
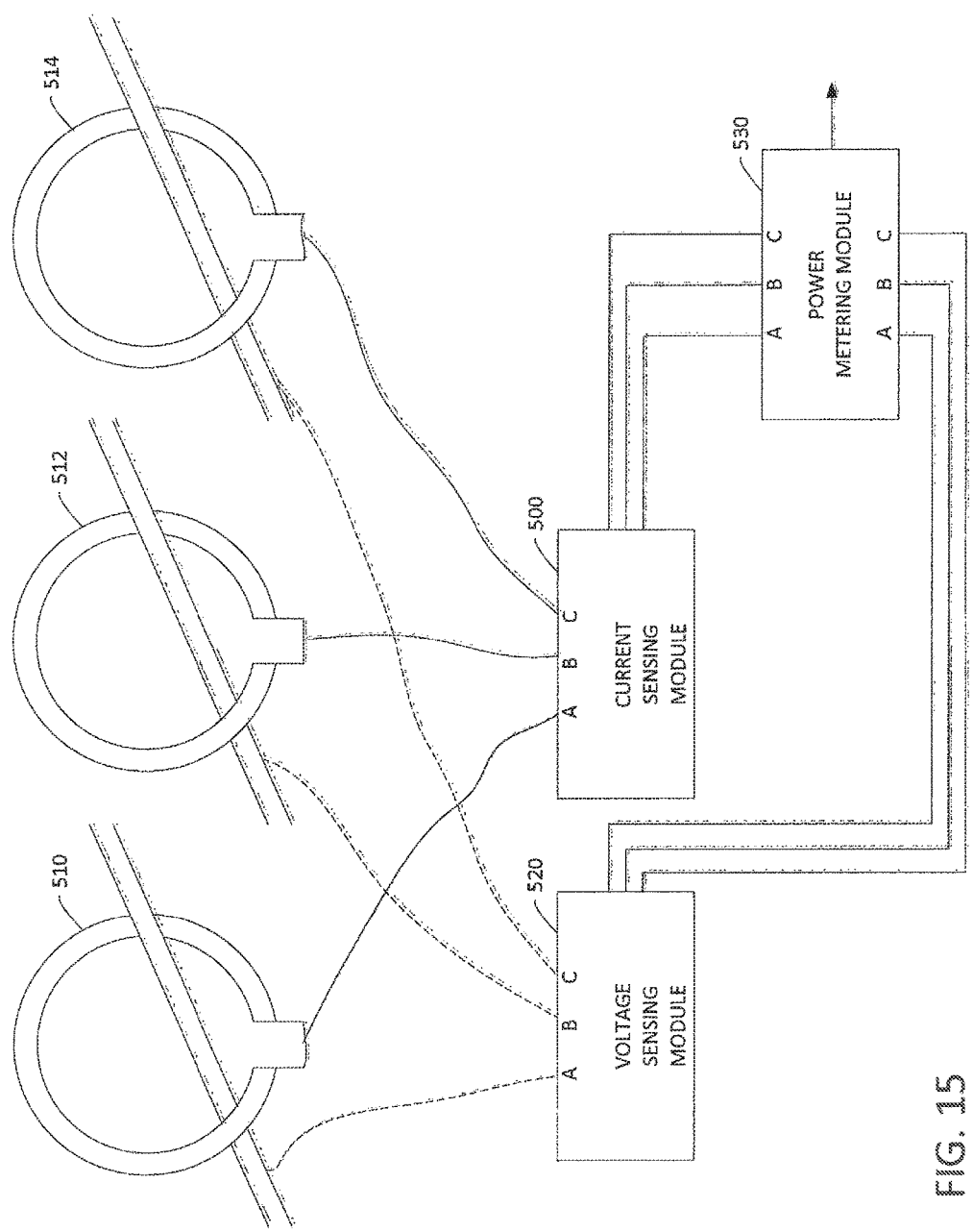
FIG. 15 illustrates Rogowski coils with typical phase alignments.

Referring to FIG. 15, a current sensing module 500 may receive signals from a plurality of Rogowski coils, such as 3 different Rogowski coils 510, 512, 514. In this manner, the set of Rogowski coils may be used to sense single phase current, two phase current, and/or three phase current. In addition, if desired, a voltage sensing module 520 may be used to sense the voltage for each of the phases, which may be accomplished using a voltage tap, a non-contact voltage sensor, the bus bars of a power panel, or otherwise. The corresponding current and voltage signals may be multiplied together by a power metering module 530, together with the phase angle if desired, to determine power related information.

Figure 16:
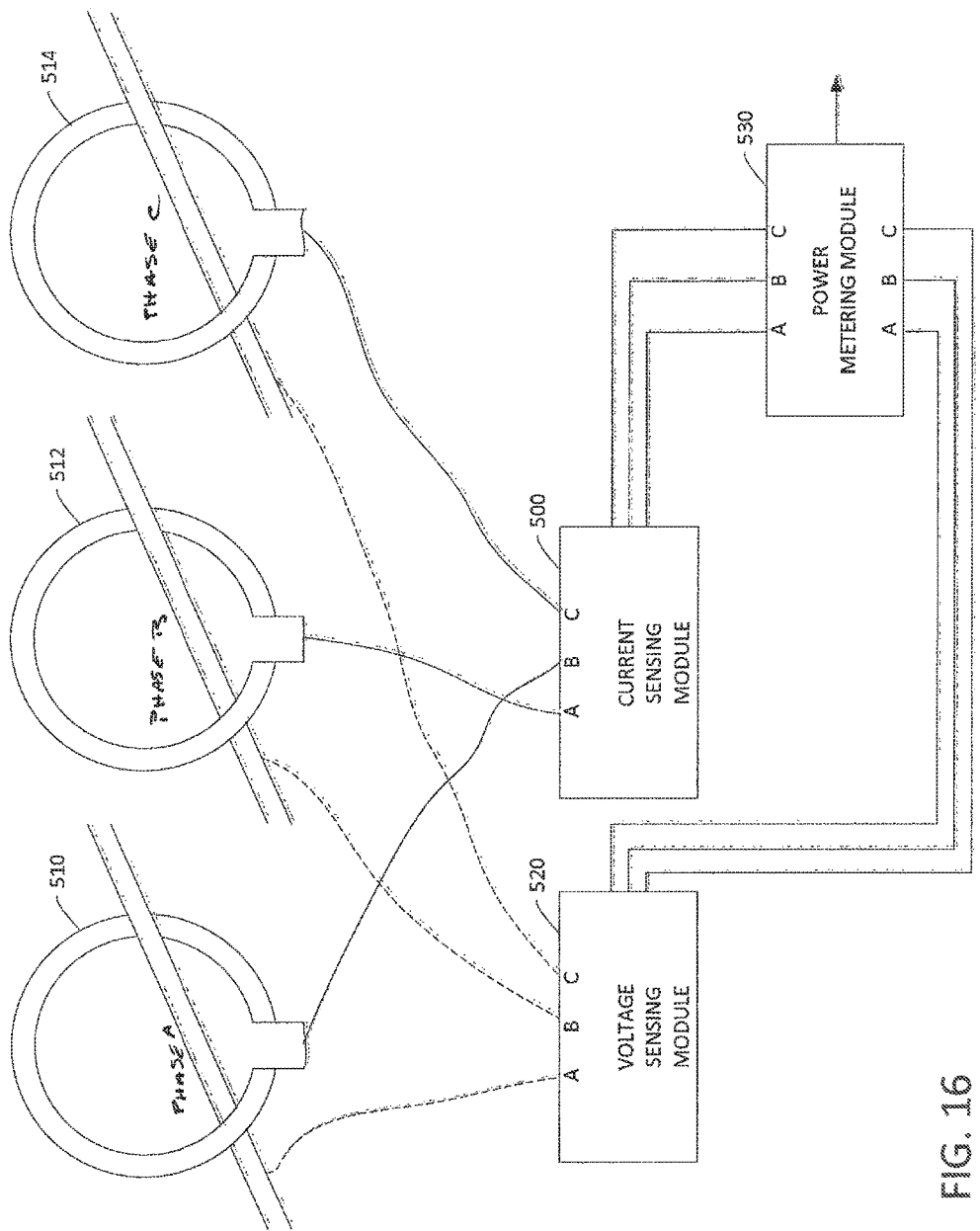
FIG. 16 illustrates Rogowski coils with non-typical phase alignments.

Referring to FIG. 16, each of the Rogowski coils 510, 512, 514 may be interconnected with the current sensing module 500 and/or the voltage sensing module 520 using a flexible connector, such as one or more flexible wires. With the flexibility in the connection of the Rogowski coils to any particular conductor, often the phases are not properly aligned between the conductors and the current sensing module and/or voltage sensing module. For example, phase A of a three phase set of conductors may be interconnected to phase A of the voltage sensing module and phase B of the current sensing module; phase B of the three phase set of conductors may be interconnected to phase B of the voltage sensing module and phase A of the current sensing module; phase C of the three phase set of conductors may be interconnected to phase C of the current sensing module and phase C of the voltage sensing module. With at least one of the phases improperly interconnected, the resulting current measurement for at least one of the phases and/or the voltage measurement for at least one of the phases will be incorrect and the resulting power measurements from the power metering module 530 will likewise be incorrect.

Figure 17:
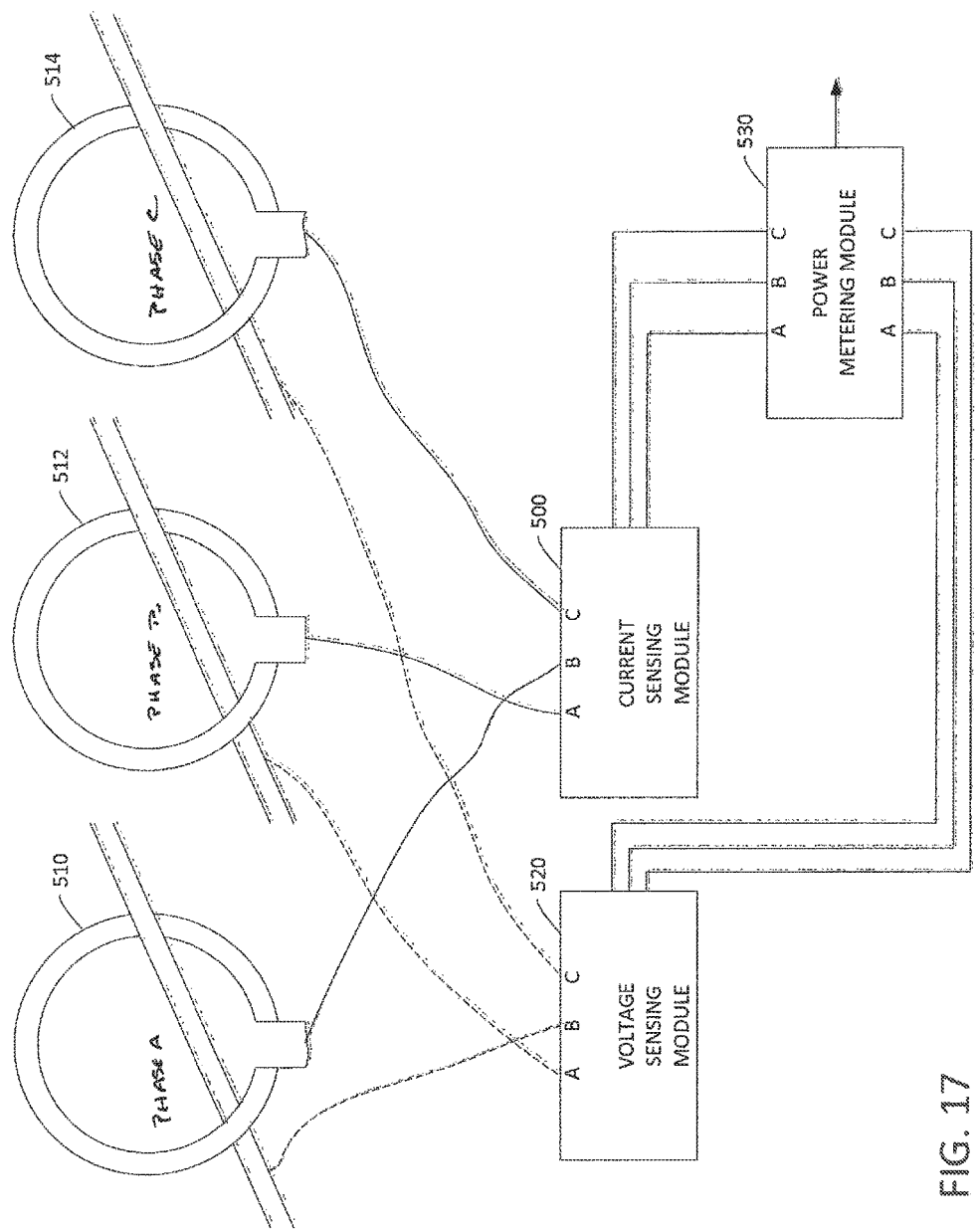
FIG. 17 illustrates Rogowski coils with non-typical phase alignments.
Figure 18:
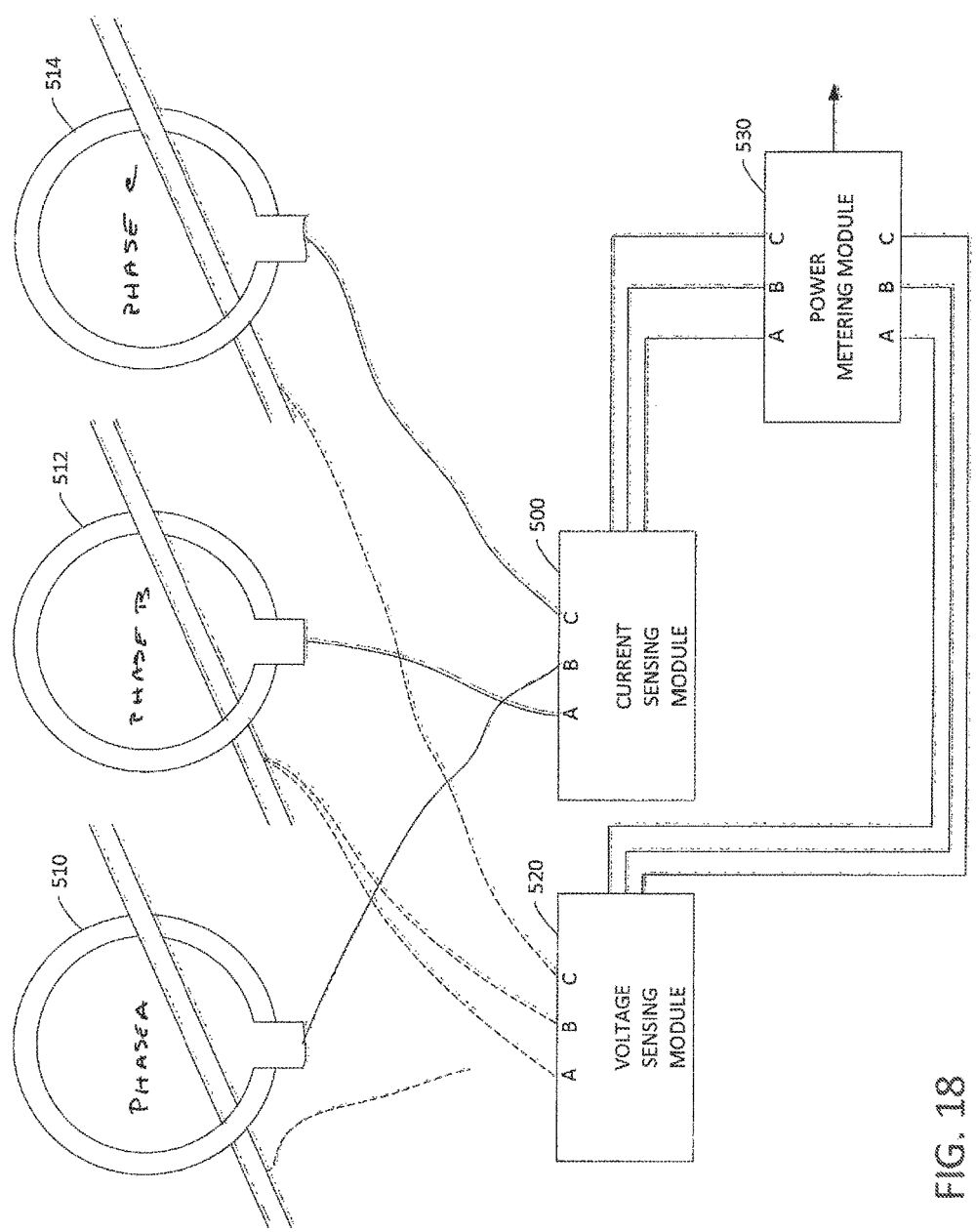
FIG. 18 illustrates Rogowski coils with coils having non-typical connections.
Figure 19:
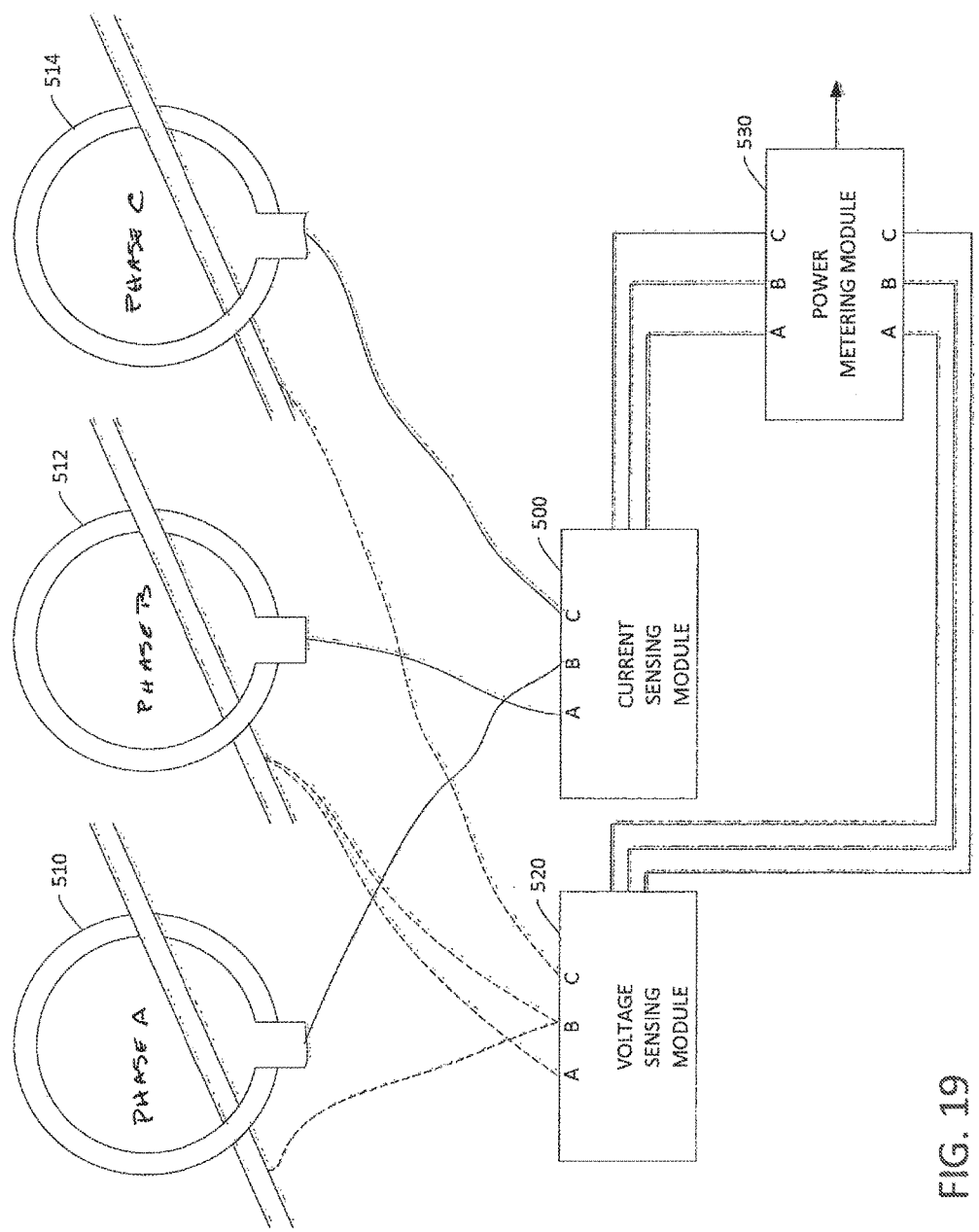
FIG. 19 illustrates Rogowski coils with coils having non-typical connections.
Figure 20:
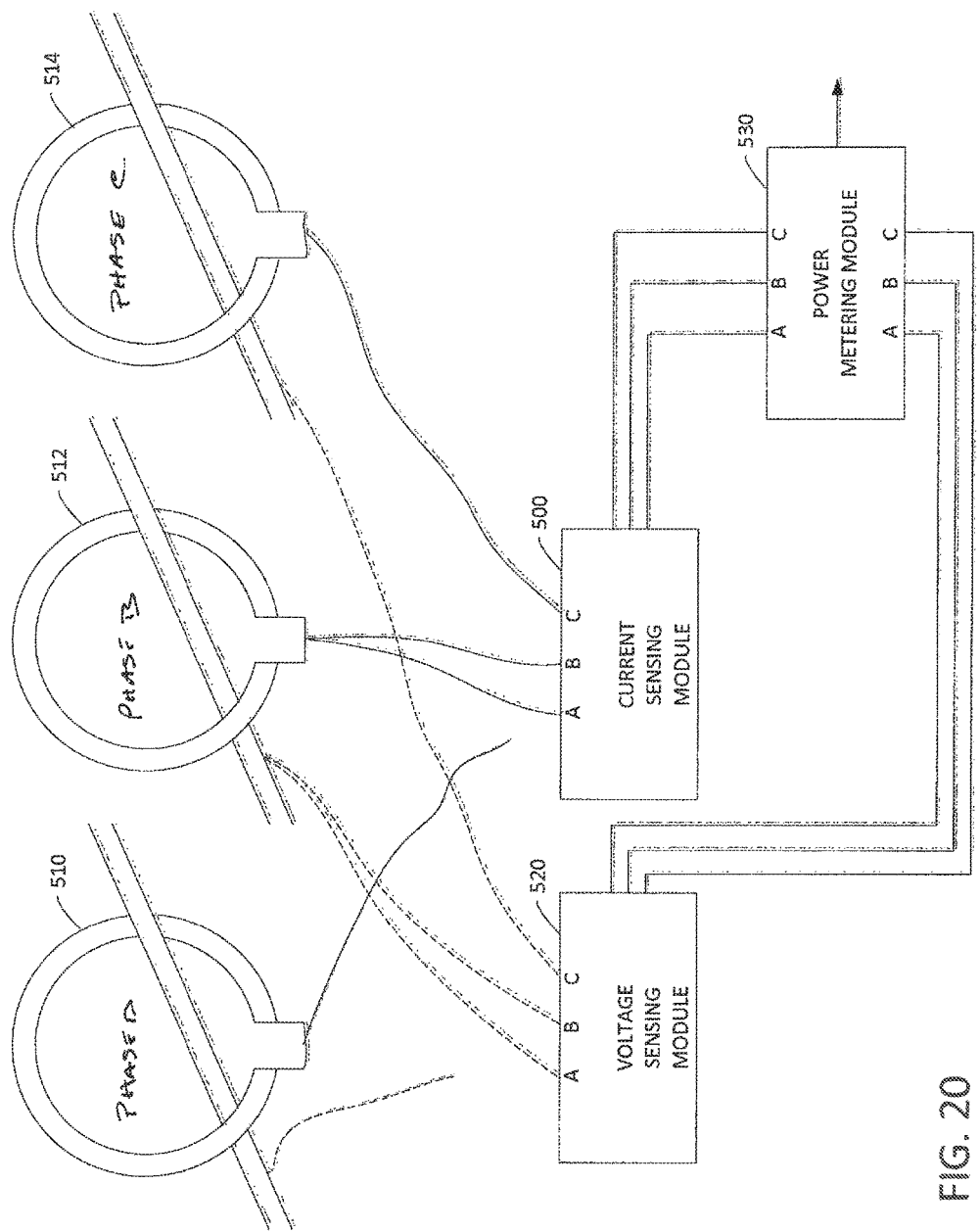
FIG. 20 illustrates Rogowski coils with one coil interconnected to multiple phases.

Attempting to configure, install, and troubleshoot Rogowski coil based installations is time consuming. For example, as illustrated in FIG. 16 the interconnections for the current and/or voltage may be improperly matched, such as reversing the connections for a pair of connections. Referring to FIG. 17 for example, the alignment of the phases A, B, and C may be improper such as aligning the Rogowski coil as Phase B, A, C which tends to result in improper power calculations even though the individual phases are properly matched together. Referring to FIG. 18 for example, the interconnection of one or more of the current and/or voltage connections may inadvertently be connected to two different phases simultaneously while one or more of the current and/or voltage connections is not connected. Referring to FIG. 19 for example, the interconnection of one or more of the current and/or voltage connections may inadvertently be connected to two different phases simultaneously and thus having multiple connections from a single connection to more than one current and/or voltage signal. Referring to FIG. 20 for example, the interconnection to one or more of the current and/or voltage connections may be inadvertently connected to two different phases simultaneously in such a manner that the same Rogowski coil is connected to two or more different phases. Other installation issues may likewise result in difficulty troubleshooting the set of Rogowski coils and otherwise ensuring that the data obtained therefrom tends to accurately represent the signals conditions within the one or more conductors.

Figure 21:
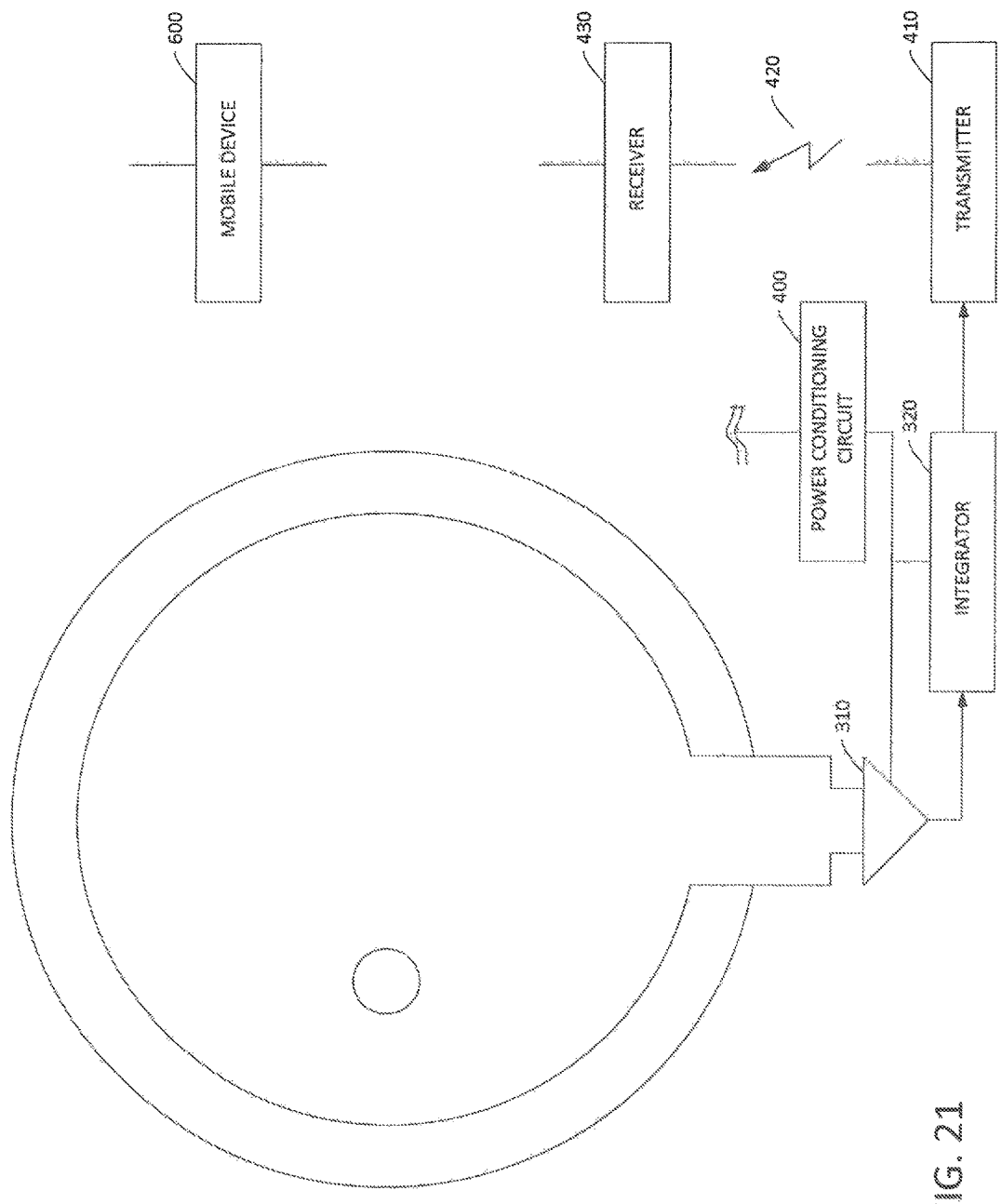
FIG. 21 illustrates a Rogowski coil together with a mobile device.

Referring to FIG. 21, a mobile device 600 such as a cellular telephone may wirelessly communicate with the Rogowski coils and its associated current and/or voltage modules. The mobile device 600 may include a keyboard or otherwise a virtual keypad in which to enter data. The mobile device 600 may include multiple buttons to enter data or make selections. The mobile device 600 preferably includes a screen suitable to display text and/or graphics thereon. The mobile device 600 may wireless communicate with the Rogowski coils, for example, using WiFi or Bluetooth pairing. The mobile device 600 may communicate with the current sensing module. The mobile device 600 may communicate with the voltage sensing module. The mobile device 600 may communicate with one or more of the Rogowski coils. The mobile device 600 may communicate with the power metering module. In general, the mobile device 600 may communicate with one or more devices proximate the Rogowski coil(s) to receive and/or send information.

Figure 22:
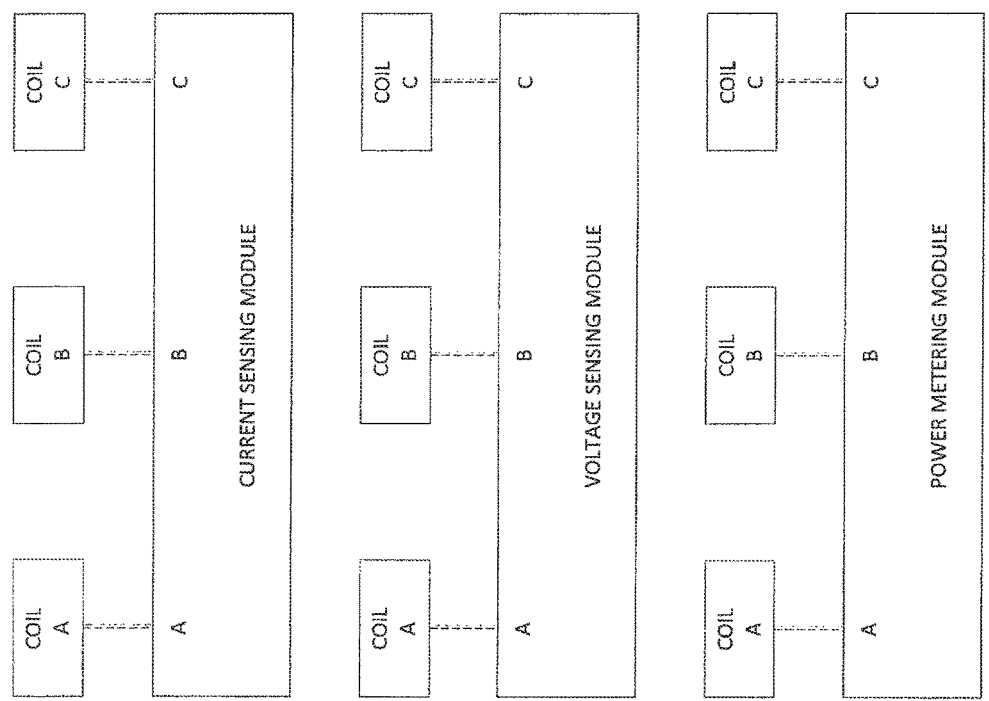
FIG. 22 illustrates coils and modules with typical connections

Referring to FIG. 22, the current and/or voltage and/or power modules may synchronize with the mobile device. The mobile device may present a graphical interface of the interconnections between the different Rogowski coils and the connections on the current and/or voltage sensing modules and/or power metering modules. For example, each of the Rogowski coils may be represented by a graphical icon together with a phase indication. In the case of a three phase circuit, the phase indications may be A, B, and C. In the case of a two phase circuit, the phase indications may be A and B, with phase C omitted. In the case of single phase circuits, the phase indications may be A, A, A. The user interface may permit the user to select among a three phase circuit, a two phase circuit, and a set of single phase circuits. Also, the user may change the indications on each of the graphical icon among A, B, and C.

Each phase of the current sensing module and/or voltage sensing module and/or power metering module may be represented by a set of graphical icons together with phase indications. In the case of a three phase circuit, the phase indications may be A, B, and C. In the case of a two phase circuit, the phase indications may be A and B, with phase C omitted. In the case of single phase circuits, the phase indications may be A, A, A. The user interface may permit the user to select among a three phase circuit, a two phase circuit, and a set of single phase circuits. Also, the user may change the phase indications on each of the graphical icons among A, B, C, and/or "not used".

The phase selections for the coils are preferably mirrored for each of the current, voltage, and power modules. Thus for a change in one of them, the change will be reflected for that coil in all of them. With the phases selected for each Rogowski coil on the graphical interface of the display, each Rogowski coil may be aligned with the phase of the current sensing module by changing the location of the graphical icon with respect to the current sensing module. In this manner, the connections between the coil and the current sensing module may be virtually changed on the graphical display of the mobile device. With the phases selected on the graphical interface of the display, each Rogowski coil may be aligned with the phase of the voltage sensing module by changing the location of the graphical icon with respect to the voltage sensing module. In this manner, the connections between the coil and the voltage sensing module may be virtually changed on the graphical display of the mobile device. With the phases selected on the graphical interface of the display, each Rogowski coil may be aligned with the phase of the power metering module by changing the location of the graphical icon with respect to the power metering module. In this manner, the connections between the coil and the power metering module may be virtually changed on the graphical display of the mobile device.

Figure 23:
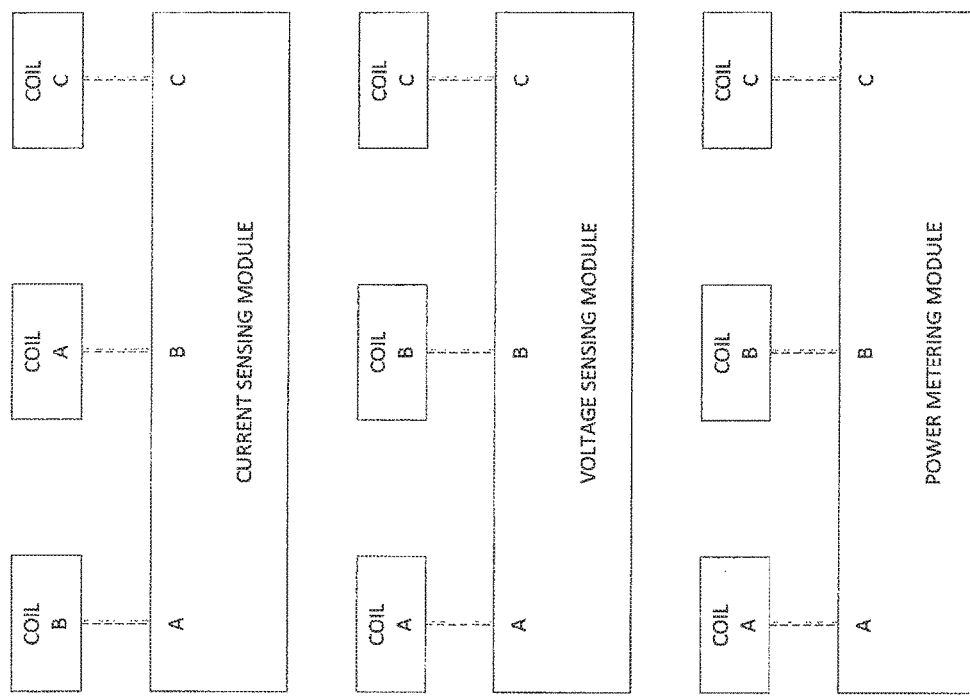
FIG. 23 illustrates coils and modules with non-typical connections.

Referring to FIG. 23, a modified graphical interface is illustrated, with interconnections realigned to match that which was installed. In the interface, coil B is interconnected with Phase A of the current sensing module and phase B of the voltage sensing module, coil A is interconnected with phase B of the current sensing module and phase A of the voltage sensing module; and coil C is interconnected with phase C of the current sensing module and phase C of the voltage sensing module. In addition, the phase relationship between A, B, and C is indicated by the arrangement of coil A, coil B, and coil C for the power metering module.

With the interconnections between the Rogowski coils graphically defined on the mobile device, the mobile device may communicate with one or more modules to update the configuration of the physical interconnection. In this manner, the outputs of the modules will be the appropriate data for phases A, B, and C together with the phase relationship between the phases, by reassigning the inputs of the modules to the appropriate outputs. For example, the input to phase A of the module which is actually phase B of the physical circuit may be reassigned to phase B of the corresponding module so the output is correct even though the input is incorrect. In this manner, the system may be reconfigured without a requirement of the installer to reconfigure the actual devices. In addition, the mobile device may be used to interrogate the current and/or voltage and/or power device to show the interconnections between the phases that were previously reassigned.

Figure 24:
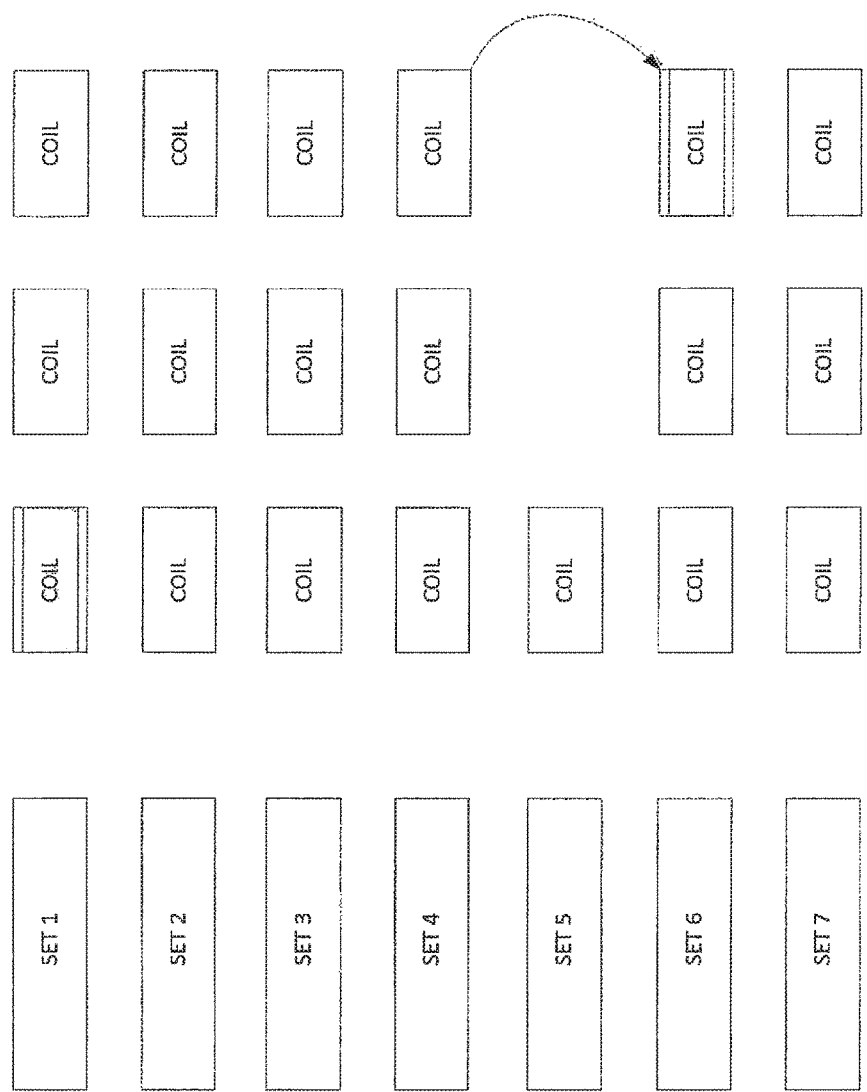
FIG. 24 illustrates sets of assigned coils.

In situations where the installer is installing a significant number of Rogowski coils, such as many as 48 Rogowski coils associated with a circuit panel, often there many sets of three phase circuits, such as 16 different three phase circuits. Each of the different three phase circuits may include a corresponding set of three Rogowski coils. Referring to FIG. 24, preferably the mobile device is used as an interface to facilitate the pairing of groups of Rogowski coils together. Each Rogowski coil preferably includes a unique identification, such as a media access control address, so that it can be distinguished uniquely from other Rogowski coils. For a set of one, two, and/or three Rogowski coils, a first coil may be paired with the mobile device and added as part of a set, a second coil may be paired with the mobile device and added as part of the same set, and a third coil may be paired with the mobile device and added as part of the same set. If desired, each of the Rogowski coils may include a button or otherwise a selection that may be performed to place it in a pairing mode or otherwise for simplified identification. In this manner, a set of one, two, and/or three Rogowski coils may be grouped together as part of a set. This process may be repeated for additional sets of one, two, or three Rogowski coils. As a result, the mobile device includes a database of the sets of Rogowski coils. Also, the set may be modified on the mobile device by moving an icon to a different set. If desired, the Rogowski coil may also include a visual indicator that is illuminated or otherwise indicated, when selected on the mobile device.

Figure 25:
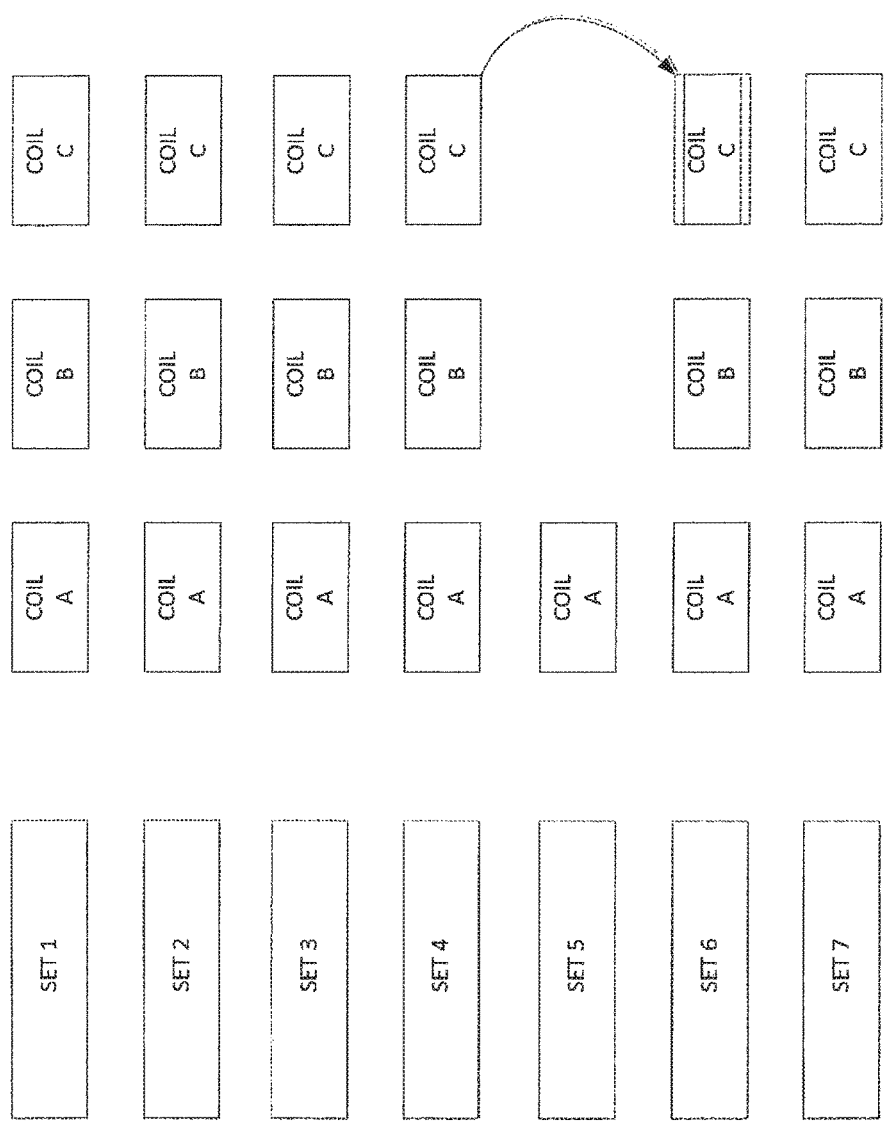
FIG. 25 illustrates sets of phase assigned coils.

Referring to FIG. 25, each of the coils of a set may be indicated as belonging to a particular phase of a multi-phase circuit, if applicable. For example, each of the Rogowski coils may be indicated as phase A, phase B, or phase C. Preferably, the mobile device does not permit the same phase to be identified for Rogowski coils of the same set. In this manner, for example, two of the Rogowski coils could not inadvertently be identified as Phase B.

Figure 26:
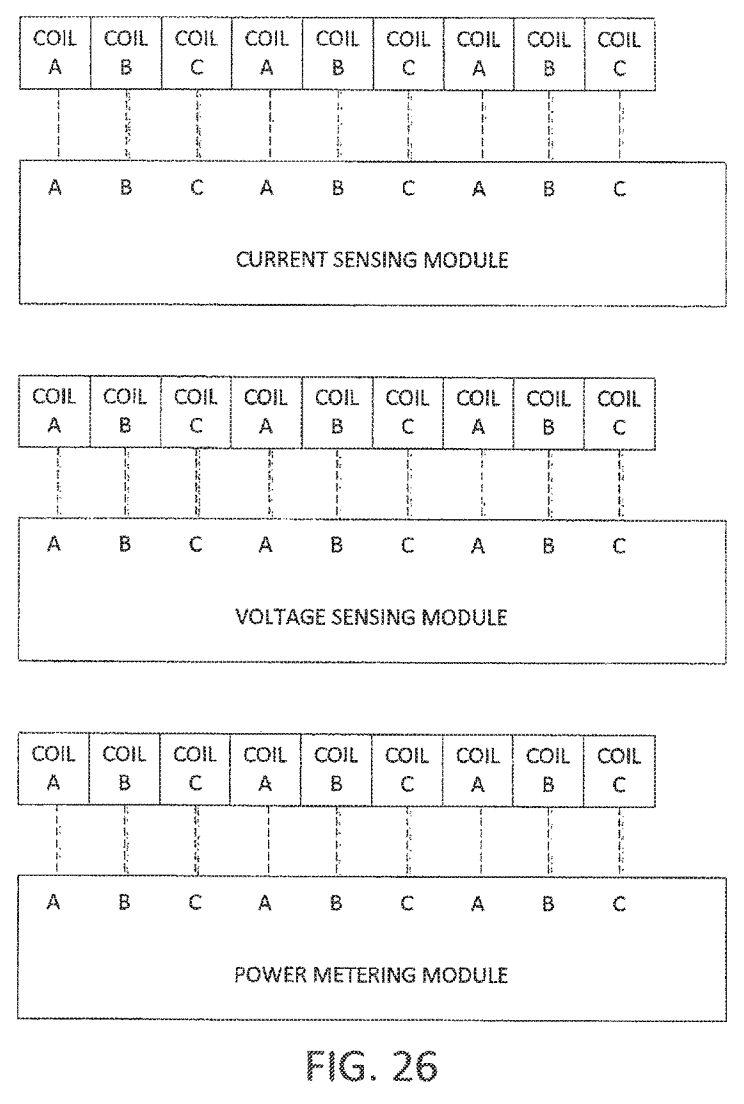

Referring to FIG. 26, a current sensing module and/or a voltage sensing monitor and/or a power metering module may be interconnected to multiple sets of Rogowski coils. The current sensing module, the voltage sensing module, and/or power metering module may be provided with data from the mobile device related to the relevant sets of Rogowski coils. In this manner, the current, voltage, and/or power modules may confirm that the sets are interconnected to corresponding connections. If the Rogowski coils are not interconnected to the appropriate connections, such as the modules checking the identification of the Rogowski coils with what is anticipated, such as a set is not interconnected to a corresponding set of connections of the module and/or the current, and/or voltage and/or phase is not interconnected properly, then an alarm or other indication may be provided. In addition, the current, voltage, and/or power modules may indicate an appropriate modification of the interconnections so that they Rogowski coils are properly interconnected. The interconnections, such as the connection to which each Rogowski coil is interconnected to together with an identification of the Rogowski coil may be provided to the mobile device. The mobile device may confirm that the sets are interconnected to corresponding connections. If the Rogowski coils are not interconnected to the appropriate connections, such as a set is not interconnected to a corresponding set of connections of the module and/or the phase is not interconnected properly, then the mobile device may provide an indication that an error is in the connection. The physical interconnection may be modified to remedy the issue, or otherwise the logical connections of the module(s) may be changed so that the Rogowski coils are suitably interconnected.

Figure 27:
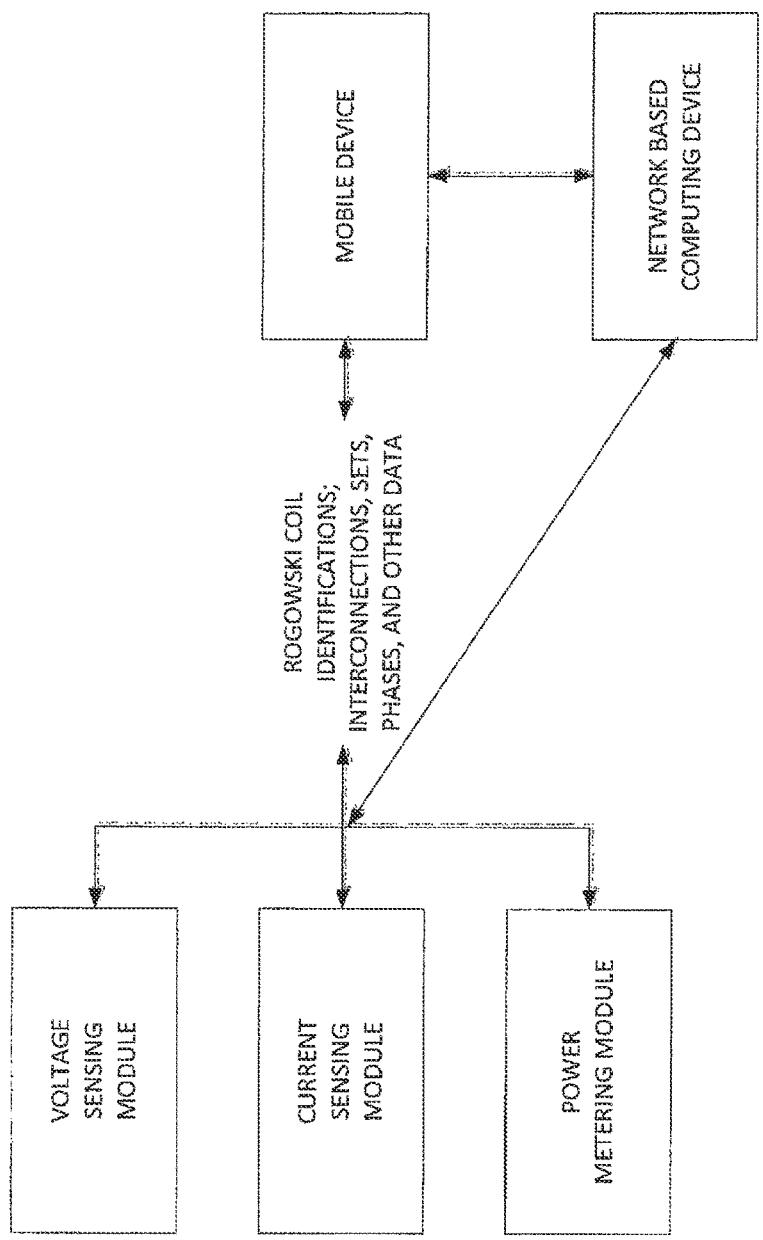
FIG. 27 illustrates a set of modules, a mobile device, and a network based computing device.

Referring to FIG. 27, the mobile device and/or the module(s) may provide to a mobile device the identification of the Rogowski coils that are interconnected to the system, together with the phase to which each Rogowski coil is interconnected to, and the set relationships of the Rogowski coils. In addition, the data may also be supplemented by the mobile device with the geographic position of the Rogowski coils based upon the location of the mobile device. The geographic position may be obtained based upon the geographic position of the mobile device, such as using the global positioning location provided by the mobile device itself. The geographic location interconnection may also be provided to the module, so they can subsequently provide their geographic location data. In this manner, a network based computing device may maintain a geographical inventory of the interconnected Rogowski coils at different geographic locations. Further, if the identification of the Rogowski coil is encoded in a manner that identifies its characteristics, or otherwise, there is also a mapping between the Rogowski coil identification to its characteristics. Accordingly network based computing device may also maintain a database of the different types of Rogowski coils together with their geographic locations.

In the event that the firmware is updated for a particular model of a Rogowski coil, such as to update the modeling of the characteristics of the Rogowski coil, or to add additional functionality to the Rogowski coil, the identification may be used to provide an update to the firmware of the Rogowski coil. With the updated firmware provided to the mobile device or otherwise available using the mobile device, the mobile device when in the vicinity of the Rogowski coil and/or its module(s) may provide the update wirelessly to the Rogowski coil and/or its modules. Further, if the geographic location of the Rogowski coil and/or the module(s) is known, then it may be easier to locate the particular Rogowski coil and/or its module(s) which have been installed long ago. Also, if the geographic location of the Rogowski coil and/or the module(s) is known, then it may be easier to update Rogowski coils and/or its module(s) based upon Rogowski coils within a particular geographic region. In this manner, the Rogowski coils may be effectively updated. The status and firmware version of the Rogowski coils may likewise be maintained by the mobile device and/or the network based computing device to use as a basis for updating.

Another feature of the Rogowski coil and/or the module(s) is the ability for the mobile device to obtain an identification of the device. Based upon this identification, the mobile device may select specifications regarding the Rogowski coil and/or module(s). Also, based upon this identification, the mobile device may request a set of specifications from the network based computing device, that provides to the mobile device the selected specifications regarding the Rogowski coil and/or module(s). The specifications may include, for example, the ce declaration, the documentation, status updates, update status of the particular device, accessories, and installation instructions. In this manner, even among a plurality of similar Rogowski coils, the installer may be provided with the proper specifications which reduces installation errors.

In some cases, the Rogowski coil includes multiple wraps around the conductor, such as a double wrap. With a double wrapped coil, the calibration parameters that are provided with the device may not be appropriate. When a Rogowski coil is interconnected with multiple wraps, the mobile device may be used to update the Rogowski coils calibration parameters so that calibration parameters associated with a double wrap are used so that the Rogowski coil is more accurate. In addition, the multiple wrapped Rogowski coil may be tagged by the mobile device, network based computing device, and/or the module(s) as being installed with a multiple wrap.

In another embodiment a conductive based core, such as a ferrite core, may be used as the current transformer. In addition, the current transformer may be a solid core or a split core current transformer.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:
1. A method of configuring a system comprising:
(a) providing a first elongate substantially flexible core material, said first elongate substantially flexible core material having a first end portion and a second end portion, said first elongate substantially flexible core material having a first middle portion between said first end portion and said second end portion, said second end portion at an opposite end of said first elongate substantially flexible core material than said first end portion, a first sensor supported by said first middle portion of said first substantially flexible core material, a first coupler that interconnects said first end portion and said second end portion of said first substantially flexible core material;
(b) providing a second elongate substantially flexible core material, said second elongate substantially flexible core material having a third end portion and a fourth end portion, said second elongate substantially flexible core material having a second middle portion between said third end portion and said fourth end portion, said fourth end portion at an opposite end of said second elongate substantially flexible core material than said third end portion, a second sensor supported by said second middle portion of said second substantially flexible core material, a second coupler that interconnects said third end portion and said fourth end portion of said second substantially flexible core material;
(c) providing a third elongate substantially flexible core material, said third elongate substantially flexible core material having a fifth end portion and a sixth end portion, said third elongate substantially flexible core material having a third middle portion between said fifth end portion and said sixth end portion, said fifth end portion at an opposite end of said third elongate substantially flexible core material than said fifth end portion, a third sensor supported by said third middle portion of said third substantially flexible core material, a third coupler that interconnects said fifth end portion and said sixth end portion of said third substantially flexible core material;
(d) interconnecting a current sensing module with said first elongate substantially flexible core material by a first flexible connector, that is interconnected with said second elongate substantially flexible core material by a second flexible connector, and that is interconnected with said third elongate substantially flexible core material by a third flexible connector with said current sensing module in such a manner that said first elongate substantially flexible core material, said second elongate substantially flexible core material, and said third elongate substantially flexible core material are freely movable with respect to one another receives a first signal from said first sensor representative of a signal within a first conductor associated with said first substantially flexible core material, a second signal from said second sensor representative of a signal within a second conductor associated with within said second substantially flexible core material, and a third signal from said third sensor representative of a signal within a third conductor associated with said third substantially flexible core material;
(e) interconnecting a voltage sensing module with said first conductor by a fourth flexible connector, that is interconnected with said second conductor by a fifth flexible connector, and that is interconnected with said third conductor by a sixth flexible connector with said voltage sensing module in such a manner that a portion of said first conductor passing through said first sensor, a portion of said second conductor passing through said second sensor, a portion of said third conductor passing through said third sensor are freely movable with respect to one another senses a first voltage corresponding to said first conductor, a second voltage corresponding to said second conductor, and a third voltage corresponding to said third conductor;
(f) wirelessly transmitting configuration information from a transmitter for said current sensing module and said voltage sensing module to a receiver that includes a configuration interface displayed on a display that wirelessly receives said configuration information for said current sensing module and said voltage sensing module, where said configuration information indicates respective pairs of the first, second, and third sensors with respective ones of the first, second, and third voltages, where said respective pairs are based upon the physical position of the interconnection of said first flexible connector, said second flexible connector, said third flexible connector with said current sensing module, and the physical position of the interconnection of said fourth flexible connector, said fifth flexible connector, said sixth flexible connector with said voltage sensing module, where said configuration information indicates said first flexible connector interconnected which is by default is considered the current from a first phase is not paired with said fourth flexible connector which is by default considered the voltage from said first phase;
(g) displaying on said configuration interface a current sensing graphic with a current phase A input, a current phase B input, and a current phase C input;
(h) displaying on said configuration interface a current phase A icon representative of said first signal, a current phase B icon representative of said second signal, a current phase C icon representative of said third signal;
(i) displaying on said configuration interface a voltage sensing graphic with a voltage phase A input, a voltage phase B input, and a voltage phase C input;
(j) displaying on said configuration interface a voltage phase A icon representative of said first voltage, a voltage phase B icon representative of said second voltage, a voltage phase C icon representative of said third voltage, where said configuration interface graphically indicates said current phase A icon is not paired with said voltage phase A icon which by default are considered the current and voltage for said first phase;
(k) displaying on said configuration interface a power sensing graphic with a power phase A, a power phase B, and a power phase C;
(l) displaying on said configuration interface a power phase A icon, a power phase B icon, a power phase C icon;
(m) reassigning on said configuration interface at least one of said current phase A icon, said current phase B icon, and said current phase C icon with respect to at least one of said current phase A input, said current phase B input, and said current phase C input by movement of one or more of said current phase A icon, said current phase B icon, said current phase C icon on said interface;
- (n) reassigning on said configuration interface at least one of said voltage phase A icon, said voltage phase B icon, and said voltage phase C icon with respect to at least one of said voltage phase A input, said voltage phase B input, and said voltage phase C input by movement of one or more of said voltage phase A icon, said voltage phase B icon, said voltage phase C icon on said interface;
- (o) determining by said receiver a revised configuration data based upon said reassigning on said configuration interface including a reassigned arrangement of at least one of,
  - (i) said current phase A input with respect to at least one of said current phase A icon, said current phase B icon, and said current phase C icon;
  - (ii) said current phase B input with respect to at least one of said current phase A icon, said current phase B icon, and said current phase C icon;
  - (iii) said current phase C input with respect to at least one of said current phase A icon, said current phase B icon, and said current phase C icon;
  - (iv) said voltage phase A input with respect to at least one of said current phase A icon, said current phase B icon, and said current phase C icon;
  - (v) said voltage phase B input with respect to at least one of said current phase A icon, said current phase B icon; or
  - (vi) said voltage phase C input with respect to at least one of said current phase A icon, said current phase B icon, and said current phase C icon;
- (p) transmitting from said receiver to said current sensing module and said voltage sensing module said revised configuration data;
- (q) said current sensing module and said voltage sensing module updating its configuration to modify its output in accordance with said revised configuration data.

2. The method of claim 1 wherein said revised configuration data including said reassigned arrangement of at least two of,
  - (i) said current phase A input with respect to at least one of said current phase A icon, said current phase B icon, and said current phase C icon;
  - (ii) said current phase B input with respect to at least one of said current phase A icon, said current phase B icon, and said current phase C icon; and
  - (iii) said current phase C input with respect to at least one of said current phase A icon, said current phase B icon, and said current phase C icon.

3. The method of claim 1 wherein said revised configuration data including said reassigned arrangement of at least three of,
  - (i) said current phase A input with respect to at least one of said current phase A icon, said current phase B icon, and said current phase C icon;
  - (ii) said current phase B input with respect to at least one of said current phase A icon, said current phase B icon, and said current phase C icon; and
  - (iii) said current phase C input with respect to at least one of said current phase A icon, said current phase B icon, and said current phase C icon.

4. The method of claim 1 wherein said revised configuration data including said reassigned arrangement of at least two of,
  - (iv) said voltage phase A input with respect to at least one of said current phase A icon, said current phase B icon, and said current phase C icon;
  - (v) said voltage phase B input with respect to at least one of said current phase A icon, said current phase B icon; and
  - (vi) said voltage phase C input with respect to at least one of said current phase A icon, said current phase B icon, and said current phase C icon.

5. The method of claim 1 wherein said revised configuration data including said reassigned arrangement of at least three of,
  - (iv) said voltage phase A input with respect to at least one of said current phase A icon, said current phase B icon, and said current phase C icon;
  - (v) said voltage phase B input with respect to at least one of said current phase A icon, said current phase B icon; and
  - (vi) said voltage phase C input with respect to at least one of said current phase A icon, said current phase B icon, and said current phase C icon.

6. The method of claim 1 wherein said revised configuration data including said reassigned arrangement of at least six of,
  - (i) said current phase A input with respect to at least one of said current phase A icon, said current phase B icon, and said current phase C icon;
  - (ii) said current phase B input with respect to at least one of said current phase A icon, said current phase B icon, and said current phase C icon;
  - (iii) said current phase C input with respect to at least one of said current phase A icon, said current phase B icon, and said current phase C icon;
  - (iv) said voltage phase A input with respect to at least one of said current phase A icon, said current phase B icon, and said current phase C icon;
  - (v) said voltage phase B input with respect to at least one of said current phase A icon, said current phase B icon; and
  - (vi) said voltage phase C input with respect to at least one of said current phase A icon, said current phase B icon, and said current phase C icon.

7. The method of claim 1 wherein a first flexible conductor electrically interconnecting said current sensing module and said first sensor.

8. The method of claim 7 wherein a second flexible conductor electrically interconnecting said current sensing module and said second sensor.

9. The method of claim 8 wherein a third flexible conductor electrically interconnecting said current sensing module and said third sensor.

10. The method of claim 1 wherein a power metering module determines a power based upon said first signal, said second signal, said third signal, said first voltage, said second voltage, and said third voltage.

* * * * *